US011605420B2

(12) United States Patent
Troia

(10) Patent No.: US 11,605,420 B2
(45) Date of Patent: *Mar. 14, 2023

(54) MEMORY WITH ARTIFICIAL INTELLIGENCE MODE

(71) Applicant: Micron Technology, Inc., Boise, ID (US)

(72) Inventor: Alberto Troia, Munich (DE)

(73) Assignee: Micron Technology, Inc., Boise, ID (US)

(*) Notice: Subject to any disclaimer, the term of this patent is extended or adjusted under 35 U.S.C. 154(b) by 1 day.

This patent is subject to a terminal disclaimer.

(21) Appl. No.: 17/314,511

(22) Filed: May 7, 2021

(65) Prior Publication Data

US 2021/0264963 A1 Aug. 26, 2021

Related U.S. Application Data

(63) Continuation of application No. 16/553,452, filed on Aug. 28, 2019, now Pat. No. 11,004,500.

(51) Int. Cl.
G11C 16/04 (2006.01)
G11C 11/409 (2006.01)
G11C 11/4074 (2006.01)
G06N 3/04 (2023.01)
G06N 3/06 (2006.01)
G11C 8/12 (2006.01)

(52) U.S. Cl.
CPC .............. G11C 11/409 (2013.01); G06N 3/04 (2013.01); G06N 3/06 (2013.01); G11C 8/12 (2013.01); G11C 11/4074 (2013.01)

(58) Field of Classification Search
CPC ...... G11C 11/409; G11C 8/12; G11C 11/4074
See application file for complete search history.

(56) References Cited

U.S. PATENT DOCUMENTS

| 5,313,586 A | 5/1994 | Rutman |
| 6,504,780 B2 | 1/2003 | Leung |
| 6,928,590 B2 | 8/2005 | Ilkbahar et al. |

(Continued)

FOREIGN PATENT DOCUMENTS

CN  108133269  6/2018

OTHER PUBLICATIONS

Sebastian et al., "Temporal Correlation Detection Using Computational Phase-change Memory", Nature Communications Journal 8, Article No. 1115, Oct. 24, 2017, pp. 1-10.

(Continued)

Primary Examiner — Pho M Luu
(74) Attorney, Agent, or Firm — Brooks, Cameron & Huebsch, PLLC

(57) ABSTRACT

An apparatus can include a number of registers configured to enable the apparatus to operate in an artificial intelligence mode to perform artificial intelligence operations and an artificial intelligence (AI) accelerator configured to perform the artificial intelligence operations using the data stored in the number of memory arrays. The AI accelerator can include hardware, software, and or firmware that is configured to perform operations associated with AI operations. The hardware can include circuitry configured as an adder and/or multiplier to perform operations, such as logic operations, associated with AI operations.

20 Claims, 11 Drawing Sheets

(56) References Cited

U.S. PATENT DOCUMENTS

| | | | |
|---|---|---|---|
| 8,395,950 B2 | 3/2013 | Lin et al. | |
| 10,990,524 B2* | 4/2021 | Huang | G06F 12/0646 |
| 11,004,500 B2* | 5/2021 | Troia | G11C 11/54 |
| 11,017,842 B2* | 5/2021 | Troia | G06N 3/08 |
| 2017/0024644 A1 | 1/2017 | Van Der Made et al. | |
| 2018/0075344 A1 | 3/2018 | Ma et al. | |
| 2018/0157970 A1 | 6/2018 | Henry et al. | |
| 2018/0189638 A1 | 7/2018 | Nurvitadhi et al. | |
| 2018/0218257 A1 | 8/2018 | Xu et al. | |
| 2018/0225056 A1 | 8/2018 | Roohparvar et al. | |
| 2019/0042538 A1 | 2/2019 | Koren et al. | |
| 2019/0057302 A1 | 2/2019 | Cho et al. | |
| 2019/0094946 A1 | 3/2019 | Pillilli et al. | |
| 2019/0108868 A1* | 4/2019 | Torng | G11C 11/16 |
| 2019/0114078 A1 | 4/2019 | Oh | |
| 2019/0114538 A1 | 4/2019 | Ng et al. | |
| 2019/0171941 A1 | 6/2019 | Quach et al. | |
| 2019/0205737 A1 | 7/2019 | Bleiweiss et al. | |
| 2019/0235867 A1 | 8/2019 | Jaffari et al. | |

OTHER PUBLICATIONS

Rios et al., "In-Memory Computing on a Photonic Platform", Jan. 18, 2018, Cornell University arXiv, retrieved from https://arxiv.org/abs/1801.06228.

"A New Brain-inspired Architecture Could Improve How Computers Handle Data and Advance AI", Oct. 3, 2018, American Institute of Physics, retrieved from https://phys.org/news/2018-10-brain-inspired-architecture-advance-ai.html.

International Search Report and Written Opinion for related PCT Application No. PCT/US2020/048067, dated Nov. 27, 2020, 13 pages.

Imani et al, "RAPIDNN: In-Memory Deep Neural Network Acceleration Framework", Apr. 11, 2019, Cornell University Arxiv, pp. 1-5 and figs. 1-7, retrieved from http://arxiv.org/pdf/1806.05794v4.pdf.

* cited by examiner

*Fig. 3A*

MEMORY WITH ARTIFICIAL INTELLIGENCE MODE

PRIORITY INFORMATION

This application is a Continuation of U.S. application Ser. No. 16/553,452, filed Aug. 28, 2019, which issues as U.S. Pat. No. 11,004,500 on May 11, 2021, the contents of which are included herein by reference.

TECHNICAL FIELD

The present disclosure relates generally to memory devices, and more particularly, to apparatuses and methods for memory with an artificial intelligence (AI) mode.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

BRIEF DESCRIPTION OF THE DRAWINGS

FIGS. 3A and 3B are block diagrams of a number of bits in a number of registers on a memory device with an artificial intelligence (AI) accelerator in accordance with a number of embodiments of the present disclosure.

DETAILED DESCRIPTION

Figure 1:
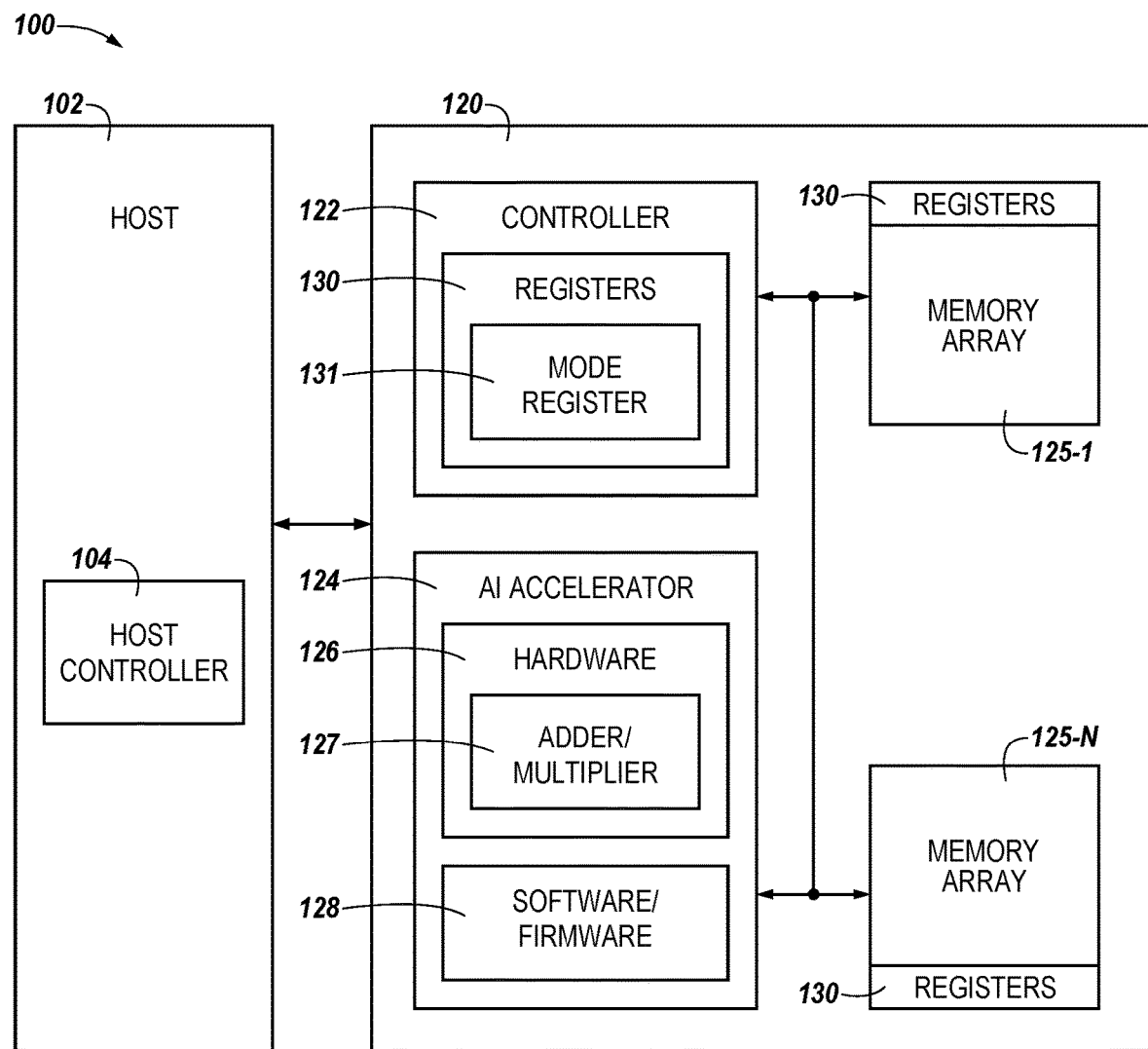
FIG. 1 is a block diagram of an apparatus in the form of a computing system including a memory device with an artificial intelligence (AI) accelerator in accordance with a number of embodiments of the present disclosure.

The present disclosure includes apparatuses and methods related to memory with an artificial intelligence (AI) mode. An example apparatus can include a number of registers configured to enable the apparatus to operate in an artificial intelligence mode to perform artificial intelligence operations and an artificial intelligence (AI) accelerator configured to perform the artificial intelligence operations using the data stored in the number of memory arrays. The AI accelerator can include hardware, software, and or firmware that is configured to perform operations associated with AI operations. The hardware can include circuitry configured as an adder and/or multiplier to perform operations, such as logic operations, associated with AI operations.

The apparatus can be configured to operate in normal mode, where the apparatus performs read and write operations, like a memory device would traditionally operate. The apparatus can be configured to operate in an AI accelerator mode, where the apparatus can be configured to perform AI operations. The apparatus can include a number of registers that can place the apparatus normal mode and/or AI mode. The number of registers can also define the location and status of the inputs, outputs, bias information of a neural network, matrixes of weights representing a neural network, and/or activation functions used by the AI accelerator to perform AI operations.

The AI accelerator can reduce latency and power consumption associated with AI operations when compared to AI operations that are performed on a host. AI operations performed on a host use data that is exchanged between a memory device and the host, which adds latency and power consumption to the AI operations. While AI operations performed according to embodiments of the present disclosure can be performed on a memory device using the AI accelerator and the memory arrays, where data is not transferred from the memory device while performing the AI operations.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a memory device 120 in accordance with a number of embodiments of the present disclosure. As used herein, a memory device 120, memory arrays 125-1, . . . 125-N, memory controller 122, and/or AI accelerator 124 might also be separately considered an "apparatus."

As illustrated in FIG. 1, host 102 can be coupled to the memory device 120. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory device 120. The host controller 108 can send commands to the memory device 120. The host controller 108 can communicate with the memory device 120, memory controller 122 on memory device 120, and/or the AI accelerator 124 on memory device 120 to perform AI operations, read data, write data, and/or erase data, among other operations. AI accelerator 124 can also include components described in associated with FIGS. 5A-8A that are configured to perform AI operations. AI operations may include machine learning or neural network operations, which may include training operations or inference operations, or both. In some example, each memory device 120 may represent a layer within a neural network or deep neural network (e.g., a network having three or more hidden layers). Or each memory device 120 may be or include nodes of a neural network, and a layer of the neural network may be composed of multiple memory devices or portions of several memory devices 120. Memory devices 120 may store weights (or models) for AI operations in memory arrays 125.

A physical host interface can provide an interface for passing control, address, data, and other signals between memory device 120 and host 102 having compatible receptors for the physical host interface. The signals can be communicated between host 102 and memory device 120 on a number of buses, such as a data bus and/or an address bus, for example.

Memory device 120 can include controller 120, AI accelerator 124, and memory arrays 125-1, . . . , 125-N. Memory device 120 can be a low-power double data rate dynamic random access memory, such as a LPDDR5 device, and/or a graphics double data rate dynamic random access memory, such as a GDDR6 device, among other types of devices. Memory arrays 125-1, . . . , 125-N can include a number of memory cells, such as volatile memory cells (e.g., DRAM memory cells, among other types of volatile memory cells) and/or non-volatile memory cells (e.g., RRAM memory cells, among other types of non-volatile memory cells). Memory device 120 can read and/or write data to memory arrays 125-1, . . . , 125-N. Memory arrays 125-1, . . . , 125-N can store data that is used during AI operations performed on memory device 120. Memory arrays 125-1, . . . , 125-N can store inputs, outputs, weight matrix and bias information of a neural network, and/or activation functions information used by the AI accelerator to perform AI operations on memory device 120.

The host controller 108, memory controller 122, and/or AI accelerator 124 on memory device 120 can include control circuitry, e.g., hardware, firmware, and/or software. In one or more embodiments, the host controller 108, memory controller 122, and/or AI accelerator 124 can be an application specific integrated circuit (ASIC) coupled to a printed circuit board including a physical interface. Also, memory controller 122 on memory device 120 can include registers 130. Registers 130 can be programmed to provide information for the AI accelerator to perform AI operations. Registers 130 can include any number of registers. Registers 130 can be written to and/or read by host 102, memory controller 122, and/or AI accelerator 124. Registers 130 can provide input, output, neural network, and/or activation functions information for AI accelerator 124. Registers 130 can include mode register 131 to select a mode of operation for memory device 120. The AI mode of operation can be selected by writing the word 0xAA and/or 0x2AA, for example, to register 131, which inhibits access to the registers associated with normal operation of memory device 120 and allows access to the registers associated with AI operations. Registers 130 can also be located in memory arrays 125-1, . . . , 125-N and be accessible by controller 122.

AI accelerator 124 can include hardware 126 and/or software/firmware 128 to perform AI operations. Also, AI accelerator 124 can also include components described in associated with FIGS. 5A-8B that are configured to perform AI operations. Hardware 126 can include adder/multiplier 126 to perform logic operations associated with AI operations. Memory controller 122 and/or AI accelerator 124 can receive commands from host 102 to perform AI operations. Memory device 120 can perform the AI operations requested in the commands from host 102 using the AI accelerator 124, data in memory arrays 125-1, . . . , 125-N, and information in registers 130. The memory device can report back information, such as results and/or error information, for example, of the AI operations to host 120. The AI operations performed by AI accelerator 124 can be performed without use of an external processing resource.

The memory arrays 125-1, . . . , 125-N can provide main memory for the memory system or could be used as additional memory or storage throughout the memory system. Each memory array 125-1, . . . , 125-N can include a number of blocks of memory cells. The blocks of memory cells can be used to store data that is used during AI operations performed by memory device 120. Memory arrays 125-1, . . . , 125-N can include DRAM memory cells, for example. Embodiments are not limited to a particular type of memory device. For instance, the memory device can include RAM, ROM, DRAM, SDRAM, PCRAM, RRAM, 3D Xpoint and flash memory, among others.

By way of example, memory device 120 may perform an AI operation that is or includes one or more inference steps. Memory arrays 125 may be layers of a neural network or may each be individual nodes and memory device 120 may be layer; or memory device 120 may be a node within a larger network. Additionally or alternatively, memory arrays 125 may store data or weights, or both, to be used (e.g., summed) within a node. Each node (e.g., memory array 125) may combine an input from data read from cells of the same or a different memory array 125 with weights read from cells of memory array 125. Combinations of weights and data may, for instance, be summed within the periphery of a memory array 125 or within hardware 126 using adder/multiplier 127. In such cases, the summed result may be passed to an activation function represented or instantiated in the periphery of a memory array 125 or within hardware 126. The result may be passed to another memory device 120 or may be used within AI accelerator 124 (e.g., by software/firmware 128) to make a decision or to train a network that includes memory device 120.

A network that employs memory device 120 may be capable of or used for supervised or unsupervised learning. This may be combined with other learning or training regimes. In some cases, a trained network or model is imported or used with memory device 120, and memory device's 120 operations are primarily or exclusively related to inference.

The embodiment of FIG. 1 can include additional circuitry that is not illustrated so as not to obscure embodiments of the present disclosure. For example, memory device 120 can include address circuitry to latch address signals provided over I/O connections through I/O circuitry. Address signals can be received and decoded by a row decoder and a column decoder to access the memory arrays 125-1, . . . , 125-N. It will be appreciated by those skilled in the art that the number of address input connections can depend on the density and architecture of the memory arrays 125-1, . . . , 125-N.

Figure 2:
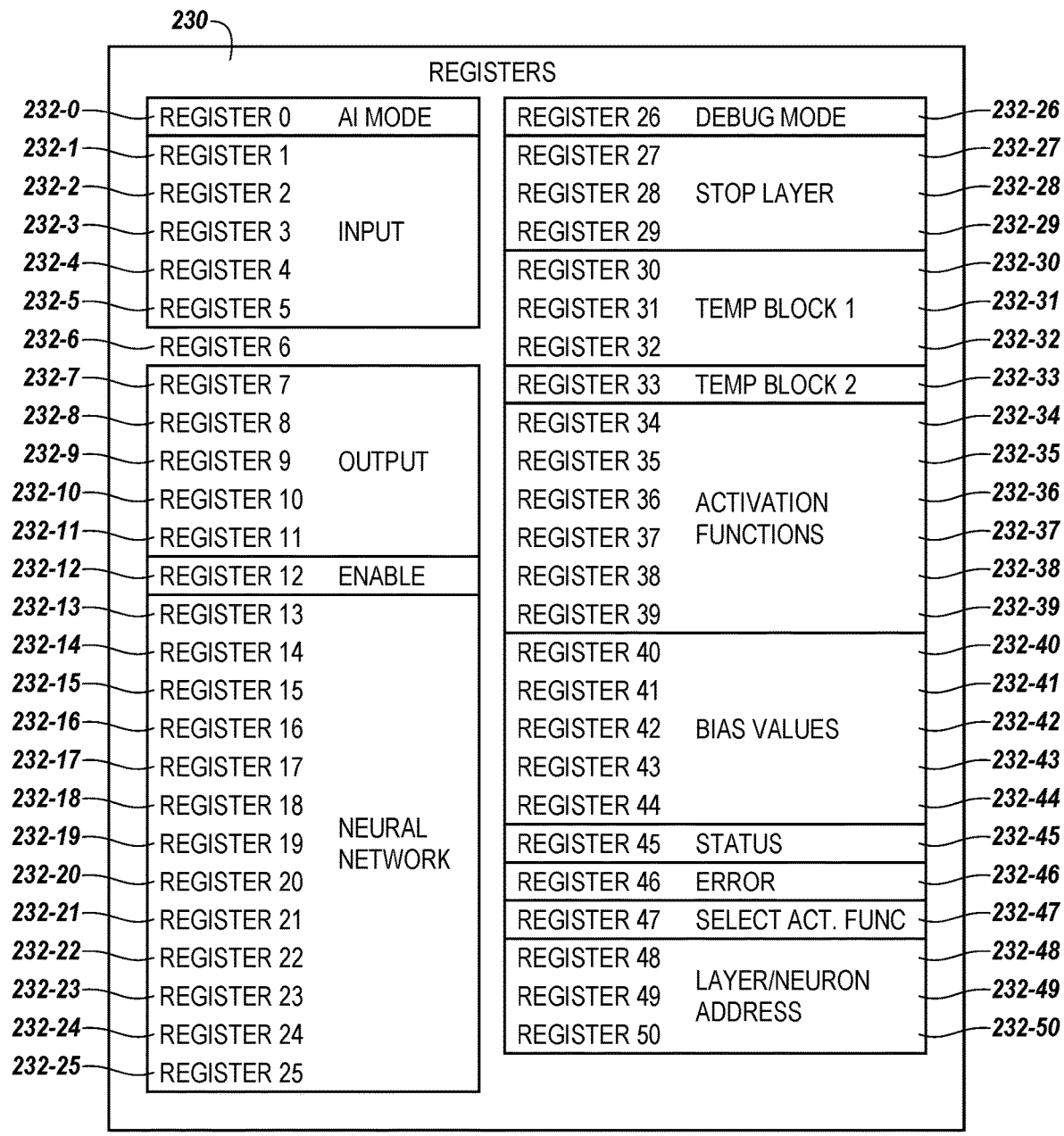
FIG. 2 is a block diagram of a number of registers on a memory device with an artificial intelligence (AI) accelerator in accordance with a number of embodiments of the present disclosure.

FIG. 2 is a block diagram of a number of registers on a memory device with an artificial intelligence (AI) accelerator in accordance with a number of embodiments of the present disclosure. Registers 230 can be AI registers and include input information, output information, neural network information, and/or activation functions information, among other types of information, for use by an AI accelerator, a controller, and/or memory arrays of a memory device (e.g., AI accelerator 124, memory controller 122, and/or memory arrays 125-1, . . . , 125-N in FIG. 1). Registers can be read and/or written to based on commands from a host, an AI accelerator, and/or a controller (e.g., host 102, AI accelerator 124, memory controller 122 in FIG. 1).

Register 232-0 can define parameters associated with AI mode of the memory device. Bits in register 232-0 can start AI operations, restart AI operations, indicate content in registers is valid, clear content from registers, and/or exit from AI mode.

Registers 232-1, 232-2, 232-3, 232-4, and 232-5 can define the size of inputs used in AI operations, the number of inputs used in AI operations, and the start address and end address of the inputs used in AI operations. Registers 232-7, 232-8, 232-9, 232-10, and 232-11 can define the size of outputs of AI operations, the number of outputs in AI operations, and the start address and end address of the outputs of AI operations.

Register 232-12 can be used to enable the usage of the input banks, the neuron banks, the output banks, the bias banks, the activation functions, and the temporary banks used during AI operations.

Registers 232-13, 232-14, 232-15, 232-16, 232-17, 232-18, 232-19, 232-20, 232-21, 232-22, 232-23, 232-24, and 232-25 can be used to define the neural network used during AI operations. Registers 232-13, 232-14, 232-15, 232-16, 232-17, 232-18, 232-19, 232-20, 232-21, 232-22, 232-23, 232-24, and 232-25 can define the size, number, and location of neurons and/or layers of the neural network used during AI operations.

Register 232-26 can enable a debug/hold mode of the AI accelerator and output to be observed at a layer of AI operations. Register 232-26 can indicate that an activation should be applied during AI operations and that the AI operation can step forward (e.g., perform a next step in an AI operation) in AI operations. Register 232-26 can indicate that the temporary blocks, where the output of the layer is located, is valid. The data in the temporary blocks can be changed by a host and/or a controller on the memory device, such that the changed data can be used in the AI operation as the AI operation steps forward. Registers 232-27, 232-28, and 232-29 can define the layer where the debug/hold mode will stop the AI operation, change the content of the neural network, and/or observe the output of the layer.

Registers 232-30, 232-31, 232-32, and 232-33 can define the size of temporary banks used in AI operations and the start address and end address of the temporary banks used in AI operations. Register 232-30 can define the start address and end address of a first temporary bank used in AI operations and register 232-33 can define the start address and end address of a first temporary bank used in AI operations. Registers 232-31, and 232-32 can define the size of the temporary banks used in AI operations.

Registers 232-34, 232-35, 232-36, 232-37, 232-38, and 232-39 can be associated with the activation functions used in AI operations. Register 232-34 can enable usage of the activation function block, enable usage of the activation function for each neuron, the activation function for each layer, and enables usage of an external activation function. Registers 232-35 can define the start address and the end address of the location of the activation functions. Registers 232-36, 232-37, 232-38, and 232-39 can define the resolution of the inputs (e.g., x-axis) and outputs (e.g., y-axis) of the activation functions and/or a custom defined activation function.

Registers 232-40, 232-41, 232-42, 232-43, and 232-44 can define the size of bias values used in AI operations, the number of bias values used in AI operations, and the start address and end address of the bias values used in AI operations.

Register 232-45 can provide status information for the AI calculations and provide information for the debug/hold mode. Register 232-45 can enable debug/hold mode, indicate that the AI accelerator is performing AI operations, indicate that the full capability of the AI accelerator should be used, indicate only matrix calculations of the AI operations should be made, and/or indicate that the AI operation can proceed to the next neuron and/or layer.

Register 232-46 can provide error information regarding AI operations. Register 232-46 can indicate that there was an error in a sequence of an AI operation, that there was an error in an algorithm of an AI operations, that there was an error in a page of data that ECC was not able to correct, and/or that there was an error in a page of data that ECC was able to correct.

Register 232-47 can indicate an activation function to use in AI operations. Register 232-47 can indicated one of a number of pre-define activation function can be used in AI operations and/or a custom activation function located in a block can be used in AI operations.

Registers 232-48, 232-49, and 232-50 can indicate the neuron and/or layer where the AI operation is executing. In the case where errors occur during the AI operations, registers 232-48, 232-49, and 232-50 the neuron and/or layer where an error occurred.

Figure 3A:
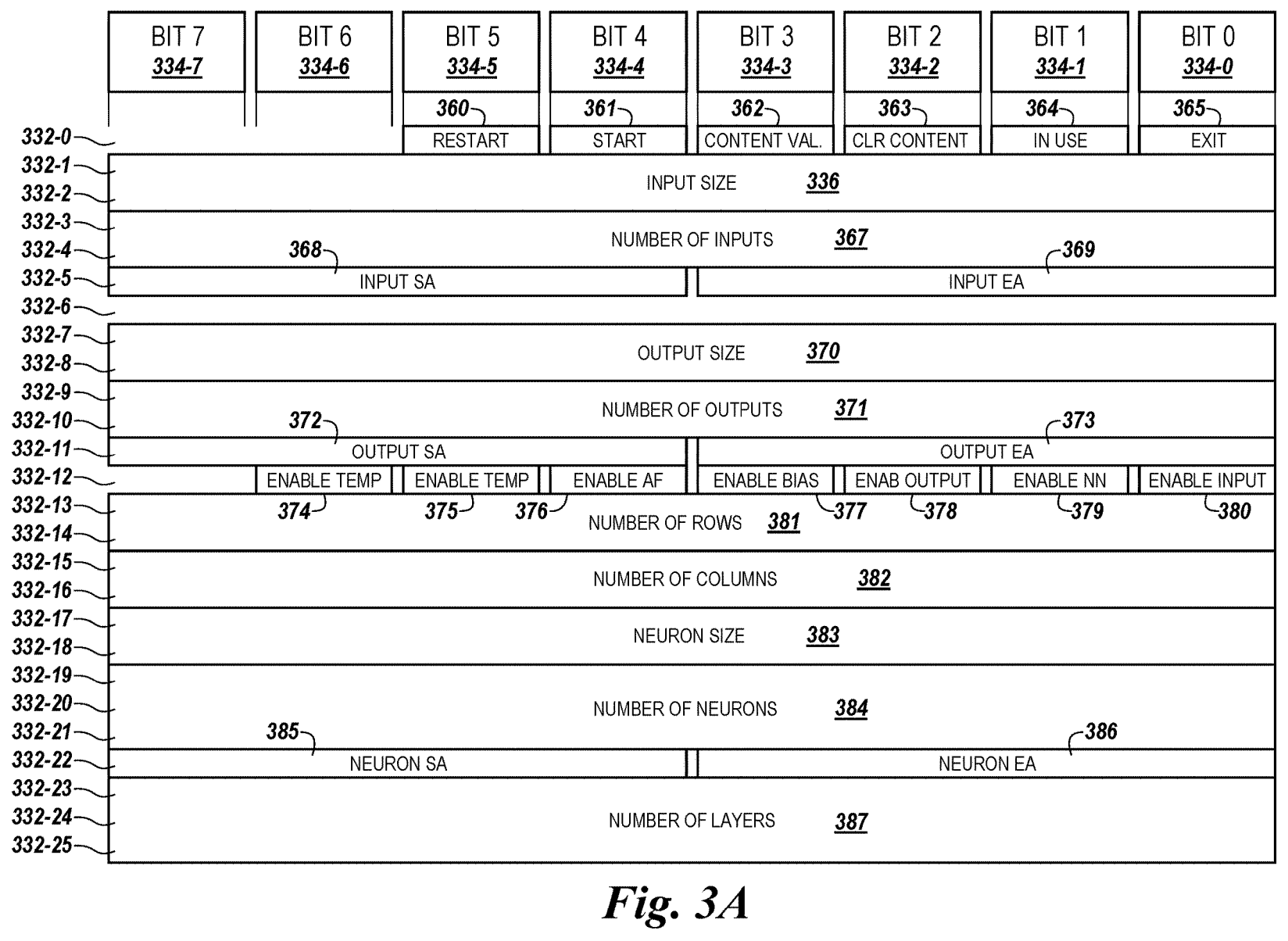
Figure 3B:
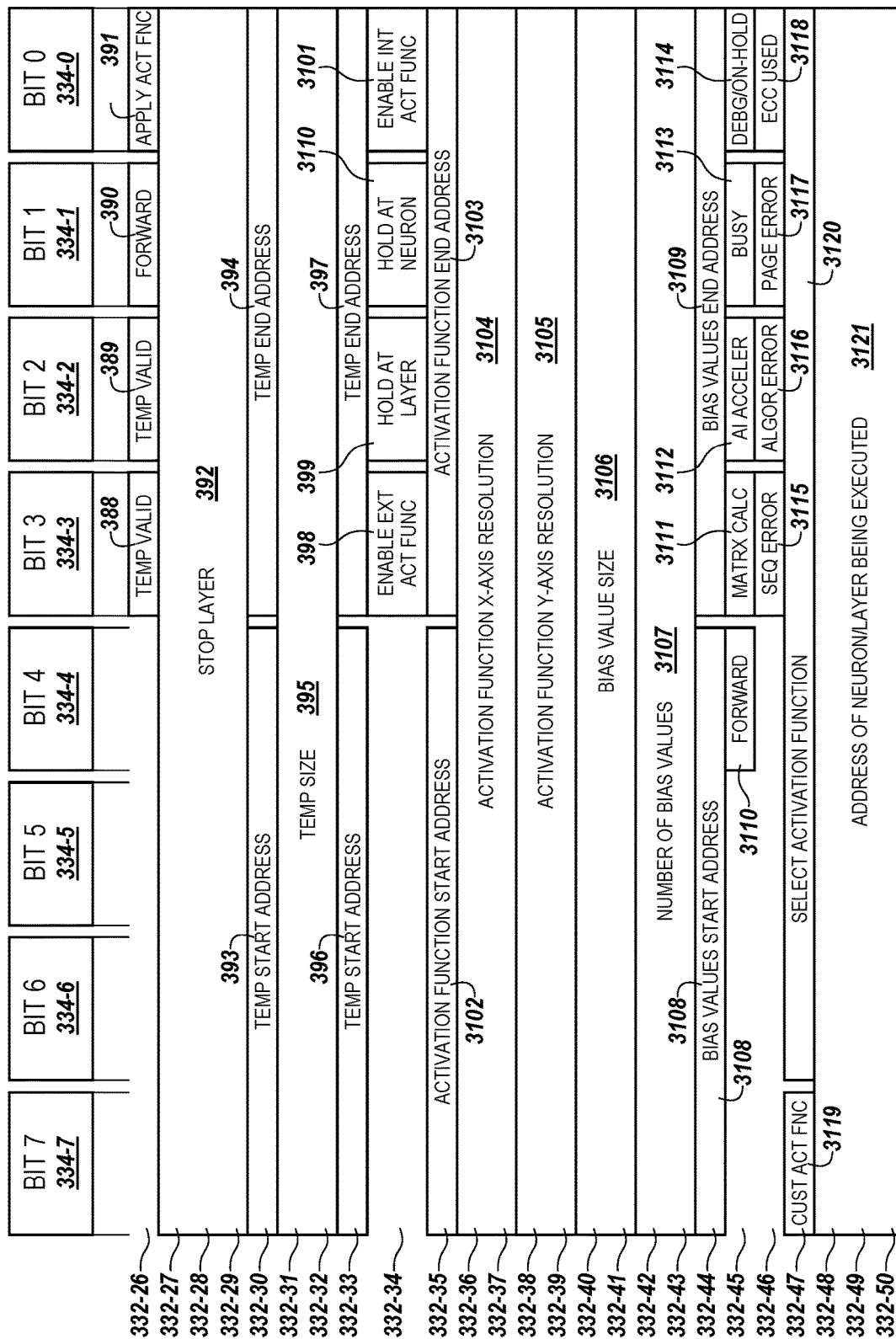

FIGS. 3A and 3B are block diagrams of a number of bits in a number of registers on a memory device with an artificial intelligence (AI) accelerator in accordance with a number of embodiments of the present disclosure. Each register 332-0, . . . , 332-50 can include a number of bits, bits 334-0, 334-1, 334-2, 334-3, 334-4, 334-5, 334-6, and 334-7, to indicate information associated with performing AI operations.

Register 332-0 can define parameters associated with AI mode of the memory device. Bit 334-5 of register 332-0 can be a read/write bit and can indicate that an elaboration of an AI operation can restart 360 at the beginning when programmed to 1b. Bit 334-5 of register 332-0 can be reset to 0b once the AI operation has restarted. Bit 334-4 of register 332-0 can be a read/write bit and can indicate that an elaboration of an AI operation can start 361 when programmed to 1b. Bit 334-4 of register 332-0 can be reset to 0b once the AI operation has started.

Bit 334-3 of register 332-0 can be a read/write bit and can indicate that the content of the AI registers is valid 362 when programmed to 1b and invalid when programmed to 0b. Bit 334-2 of register 332-0 can be a read/write bit and can indicate that the content of the AI registers is to be cleared 363 when programmed to 1b. Bit 334-1 of register 332-0 can be a read only bit and can indicate that the AI accelerator is in use 363 and performing AI operations when programmed to 1b. Bit 334-0 of register 332-0 can be a write only bit and can indicate that the memory device is to exit 365 AI mode when programmed to 1b.

Registers 332-1, 332-2, 332-3, 332-4, and 332-5 can define the size of inputs used in AI operations, the number of inputs used in AI operations, and the start address and end address of the inputs used in AI operations. Bits 334-0, 334-1, 334-2, 334-3, 334-4, 334-5, 334-6, and 334-7 of registers 332-1 and 332-2 can define the size of the inputs 366 used in AI operations. The size of the inputs can indicate the width of the inputs in terms of number of bits and/or the type of input, such as floating point, integer, and/or double, among other types. Bits 334-0, 334-1, 334-2, 334-3, 334-4, 334-5, 334-6, and 334-7 of registers 332-3 and 332-4 can indicate the number of inputs 367 used in AI operations. Bits 334-4, 334-5, 334-6, and 334-7 of register 332-5 can indicate a start address 368 of the blocks in memory arrays of the inputs used in AI operations. Bits 334-0, 334-1, 334-2, and 334-3 of register 332-5 can indicate an end address 369 of the blocks in memory arrays of the inputs used in AI operations. If the start address 368 and the end address 369 is the same address, only one block of input is indicated for the AI operations.

Registers 332-7, 332-8, 332-9, 332-10, and 332-11 can define the size of outputs of AI operations, the number of outputs in AI operations, and the start address and end address of the outputs of AI operations. Bits 334-0, 334-1, 334-2, 334-3, 334-4, 334-5, 334-6, and 334-7 of registers 332-7 and 332-8 can define the size 370 of the outputs used in AI operations. The size of the outputs can indicate the width of the outputs in terms of number of bits and/or the type of output, such as floating point, integer, and/or double, among other types. Bits 334-0, 334-1, 334-2, 334-3, 334-4, 334-5, 334-6, and 334-7 of registers 332-9 and 332-10 can indicate the number of outputs 371 used in AI operations. Bits 334-4, 334-5, 334-6, and 334-7 of register 332-11 can indicate a start address 372 of the blocks in memory arrays of the outputs used in AI operations. Bits 334-0, 334-1, 334-2, and 334-3 of register 332-11 can indicate an end address 373 of the blocks in memory arrays of the outputs used in AI operations. If the start address 372 and the end address 373 is the same address, only one block of output is indicated for the AI operations.

Register 332-12 can be used to enable the usage of the input banks, the neuron banks, the output banks, the bias banks, the activation functions, and the temporary banks used during AI operations. Bit 334-0 of register 332-12 can enable the input banks 380, bit 334-1 of register 332-12 can enable the neural network banks 379, bit 334-2 of register 332-12 can enable the output banks 378, bit 334-3 of register 332-12 can enable the bias banks 377, bit 334-4 of register 332-12 can enable the activation function banks 376, and bit 334-5 and 334-6 of register 332-12 can enable a first temporary 375 banks and a second temporary bank 374.

Registers 332-13, 332-14, 332-15, 332-16, 332-17, 332-18, 332-19, 332-20, 332-21, 332-22, 332-23, 332-24, and 332-25 can be used to define the neural network used during AI operations. Bits 334-0, 334-1, 334-2, 334-3, 334-4, 334-5, 334-6, and 334-7 of registers 332-13 and 332-14 can define the number of rows 381 in a matrix used in AI operations. Bits 334-0, 334-1, 334-2, 334-3, 334-4, 334-5, 334-6, and 334-7 of registers 332-15 and 332-16 can define the number of columns 382 in a matrix used in AI operations.

Bits 334-0, 334-1, 334-2, 334-3, 334-4, 334-5, 334-6, and 334-7 of registers 332-17 and 332-18 can define the size of the neurons 383 used in AI operations. The size of the neurons can indicate the width of the neurons in terms of number of bits and/or the type of input, such as floating point, integer, and/or double, among other types. Bits 334-0, 334-1, 334-2, 334-3, 334-4, 334-5, 334-6, and 334-7 of registers 332-19, 332-20, and 322-21 can indicate the number of neurons 384 of the neural network used in AI operations. Bits 334-4, 334-5, 334-6, and 334-7 of register 332-22 can indicate a start address 385 of the blocks in memory arrays of the neurons used in AI operations. Bits 334-0, 334-1, 334-2, and 334-3 of register 332-5 can indicate an end address 386 of the blocks in memory arrays of the neurons used in AI operations. If the start address 385 and the end address 386 is the same address, only one block of neurons is indicated for the AI operations. Bits 334-0, 334-1, 334-2, 334-3, 334-4, 334-5, 334-6, and 334-7 of registers 332-23, 332-24, and 322-25 can indicate the number of layers 387 of the neural network used in AI operations.

Register 332-26 can enable a debug/hold mode of the AI accelerator and an output to be observed at a layer of AI operations. Bit 334-0 of register 332-26 can indicate that the AI accelerator is in a debug/hold mode and that an activation function should be applied 391 during AI operations. Bit 334-1 of register 332-26 can indicate that the AI operation can step forward 390 (e.g., perform a next step in an AI operation) in AI operations. Bit 334-2 and bit 334-3 of register 232-26 can indicate that the temporary blocks, where the output of the layer is located, is valid 388 and 389. The data in the temporary blocks can be changed by a host and/or a controller on the memory device, such that the changed data can be used in the AI operation as the AI operation steps forward.

Bits 334-0, 334-1, 334-2, 334-3, 334-4, 334-5, 334-6, and 334-7 of registers 332-27, 332-28, and 332-29 can define the layer where the debug/hold mode will stop 392 the AI operation and observe the output of the layer.

Registers 332-30, 332-31, 332-32, and 332-33 can define the size of temporary banks used in AI operations and the start address and end address of the temporary banks used in AI operations. Bits 334-4, 334-5, 334-6, and 334-7 of register 332-30 can define the start address 393 of a first temporary bank used in AI operations. Bits 334-0, 334-1, 334-2, and 334-3 of register 332-30 can define the end address 394 of a first temporary bank used in AI operations. Bits 334-0, 334-1, 334-2, 334-3, 334-4, 334-5, 334-6, and 334-7 of registers 332-31 and 332-32 can define the size 395 of the temporary banks used in AI operations. The size of the temporary banks can indicate the width of the temporary banks in terms of number of bits and/or the type of input, such as floating point, integer, and/or double, among other types. Bits 334-4, 334-5, 334-6, and 334-7 of register 332-33 can define the start address 396 of a second temporary bank used in AI operations. Bits 334-0, 334-1, 334-2, and 334-3 of register 332-34 can define the end address 397 of a second temporary bank used in AI operations.

Registers 332-34, 332-35, 332-36, 332-37, 332-38, and 332-39 can be associated with the activation functions used in AI operations. Bit 334-0 of register 332-34 can enable usage of the activation function block 3101. Bit 334-1 of register 332-34 can enable holding that AI at a neuron 3100 and usage of the activation function for each neuron. Bit 334-2 of register 332-34 can enable holding the AI at a layer 399 and the usage of the activation function for each layer. Bit 334-3 of register 332-34 can enable usage of an external activation function 398.

Bits 334-4, 334-5, 334-6, and 334-7 of register 332-35 can define the start address 3102 of activation function banks used in AI operations. Bits 334-0, 334-1, 334-2, and 334-3 of register 332-35 can define the end address 3103 of activation functions banks used in AI operations. Bits 334-0, 334-1, 334-2, 334-3, 334-4, 334-5, 334-6, and 334-7 of registers 332-36 and 332-37 can define the resolution of the inputs (e.g., x-axis) 3104 of the activation functions. Bits 334-0, 334-1, 334-2, 334-3, 334-4, 334-5, 334-6, and 334-7 of registers 332-38 and 332-39 can define the resolution and/or the outputs (e.g., y-axis) 3105 of the activation functions for a given x-axis value of a custom activation function.

Registers 332-40, 332-41, 332-42, 332-43, and 332-44 can define the size of bias values used in AI operations, the number of bias values used in AI operations, and the start address and end address of the bias values used in AI operations. Bits 334-0, 334-1, 334-2, 334-3, 334-4, 334-5, 334-6, and 334-7 of registers 332-40 and 332-41 can define the size of the bias values 3106 used in AI operations. The size of the bias values can indicate the width of the bias values in terms of number of bits and/or the type of bias values, such as floating point, integer, and/or double, among other types. Bits 334-0, 334-1, 334-2, 334-3, 334-4, 334-5, 334-6, and 334-7 of registers 332-42 and 332-43 can indicate the number of bias values 3107 used in AI operations. Bits 334-4, 334-5, 334-6, and 334-7 of register 332-44 can indicate a start address 3108 of the blocks in memory arrays of the bias values used in AI operations. Bits 334-0, 334-1, 334-2, and 334-3 of register 332-44 can indicate an end address 3109 of the blocks in memory arrays of the bias values used in AI operations. If the start address 3108 and the end address 3109 is the same address, only one block of bias values is indicated for the AI operations.

Register 332-45 can provide status information for the AI calculations and provide information for the debug/hold mode. Bit 334-0 of register 332-45 can activate the debug/hold mode 3114. Bit 334-1 of register can indicate that the AI accelerator is busy 3113 and performing AI operations. Bit 334-2 of register 332-45 can indicate that the AI accelerator is on 3112 and/or that the full capability of the AI accelerator should be used. Bit 334-3 of register 332-45 can indicate only matrix calculations 3111 of the AI operations should be made. Bit. 334-4 of register 332-45 can indicate that the AI operation can step forward 3110 and proceed to the next neuron and/or layer.

Register 332-46 can provide error information regarding AI operations. Bit 334-3 of register 332-46 can indicate that there was an error in a sequence 3115 of an AI operation. Bit 334-2 of register 332-46 can indicate that there was an error in an algorithm 3116 of an AI operation. Bit 334-1 of register 332-46 can indicate there was an error in a page of data that ECC was not able to correct 3117. Bit 334-0 of register 332-46 can indicate there was an error in a page of data that ECC was able to correct 3118.

Register 332-47 can indicate an activation function to use in AI operations. Bits 334-0, 334-1, 334-2, 334-3, 334-4, 334-5, and 334-6 of register 332-47 can indicate one of a number of pre-define activation functions 3120 can be used in AI operations. Bit 334-7 of register 332-47 can indicate a custom activation function 3119 located in a block can be used in AI operations.

Registers 332-48, 332-49, and 332-50 can indicate the neuron and/or layer where the AI operation is executing. Bits 334-0, 334-1, 334-2, 334-3, 334-4, 334-5, 334-6, and 334-7 of registers 332-48, 332-49, and 332-50 can indicate the address of the neuron and/or layer where the AI operation is executing. In the case where errors occur during the AI operations, registers 332-48, 332-49, and 332-50 can indicate the neuron and/or layer where an error occurred.

Figure 4:
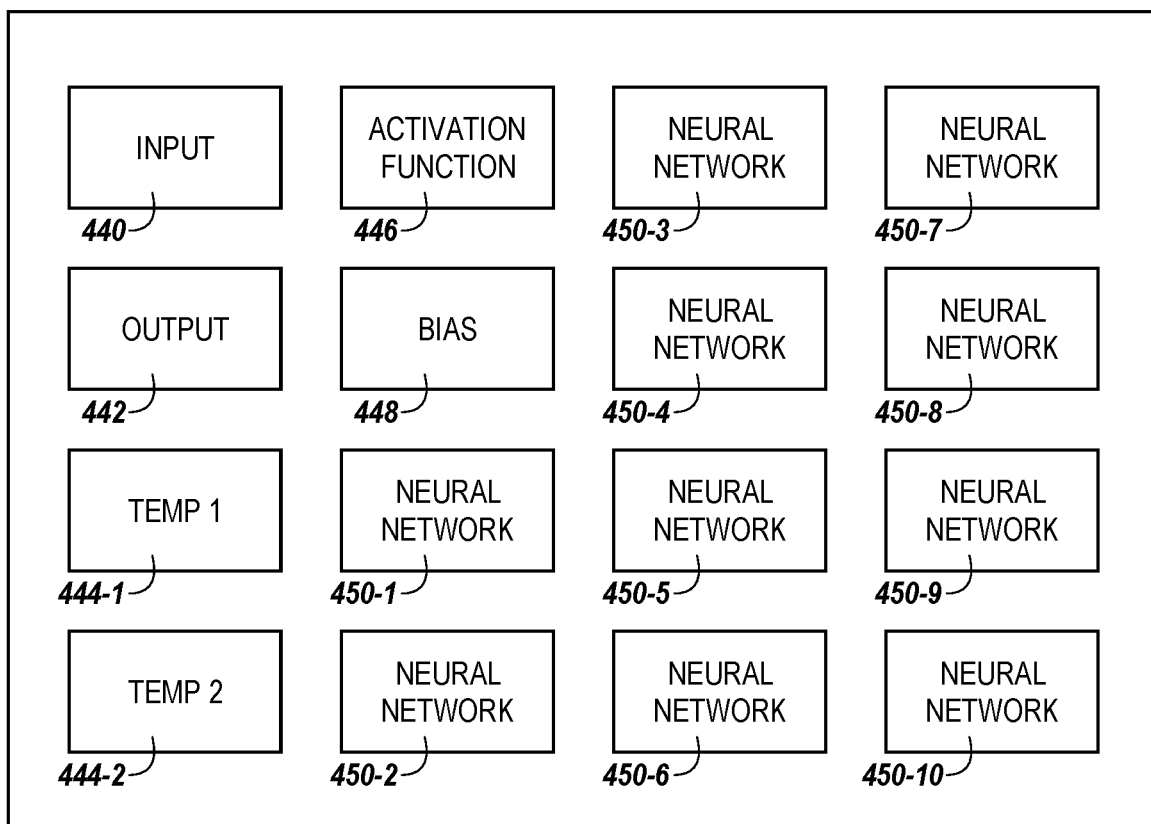
FIG. 4 is a block diagram of a number of blocks of a memory device with an artificial intelligence (AI) accelerator in accordance with a number of embodiments of the present disclosure.

FIG. 4 is a block diagram of a number of blocks of a memory device with an artificial intelligence (AI) accelerator in accordance with a number of embodiments of the present disclosure. Input block 440 is a block in the memory arrays where input data is stored. Data in input block 440 can be used as the input for AI operations. The address of input block 440 can be indicated in register 5 (e.g. register 232-5 in FIGS. 2 and 332-5 in FIG. 3A). Embodiments are not limited to one input block as there can be a plurality of input blocks. Data input block 440 can be sent to the memory device from the host. The data can accompany a command indicated that AI operations should be performed on the memory device using the data.

Output block 420 is a block in the memory arrays where output data from AI operations is stored. Data in output block 442 can be used store the output from AI operations and sent to the host. The address of output block 442 can be indicated in register 11 (e.g. register 232-11 in FIGS. 2 and 332-11 in FIG. 3A). Embodiments are not limited to one output block as there can be a plurality of output blocks.

Data in output block 442 can be sent to host upon completion and/or holding of an AI operation. Temporary blocks 444-1 and 444-2 can be blocks in memory arrays where data is stored temporarily while AI operations are being performed. Data can be stored in temporary blocks 444-1 and 444-2 while the AI operations are iterating through the neuron and layers of the neural network used for the AI operations. The address of temporary block 448 can be indicated in registers 30 and 33 (e.g. registers 232-30 and 232-33 in FIGS. 2 and 332-30 and 332-33 in FIG. 3B). Embodiments are not limited to two temporary blocks as there can be a plurality of temporary blocks.

Activation function block 446 is a block in the memory arrays where the activations functions for the AI operations are stored. Activation function block 446 can store pre-defined activation functions and/or custom activation functions that are created by the host and/or AI accelerator. The address of activation function block 448 can be indicated in register 35 (e.g. register 232-35 in FIGS. 2 and 332-35 in FIG. 3B). Embodiments are not limited to one activation function block as there can be a plurality of activation function blocks.

Bias values block 448 is a block in the memory array where the bias values for the AI operations are stored. The address of bias values block 448 can be indicated in register 44 (e.g. register 232-44 in FIGS. 2 and 332-44 in FIG. 3B). Embodiments are not limited to one bias value block as there can be a plurality of bias value blocks.

Neural network blocks 450-1, 450-2, 450-3, 450-4, 450-5, 450-6, 450-7, 450-8, 450-9, and 450-10 are a block in the memory array where the neural network for the AI operations are stored. Neural network blocks 450-1, 450-2, 450-3, 450-4, 450-5, 450-6, 450-7, 450-8, 450-9, and 450-10 can store the information for the neurons and layers that are used in the AI operations. The address of neural network blocks 450-1, 450-2, 450-3, 450-4, 450-5, 450-6, 450-7, 450-8, 450-9, and 450-10 can be indicated in register 22 (e.g. register 232-22 in FIGS. 2 and 332-22 in FIG. 3A).

Figure 5A:
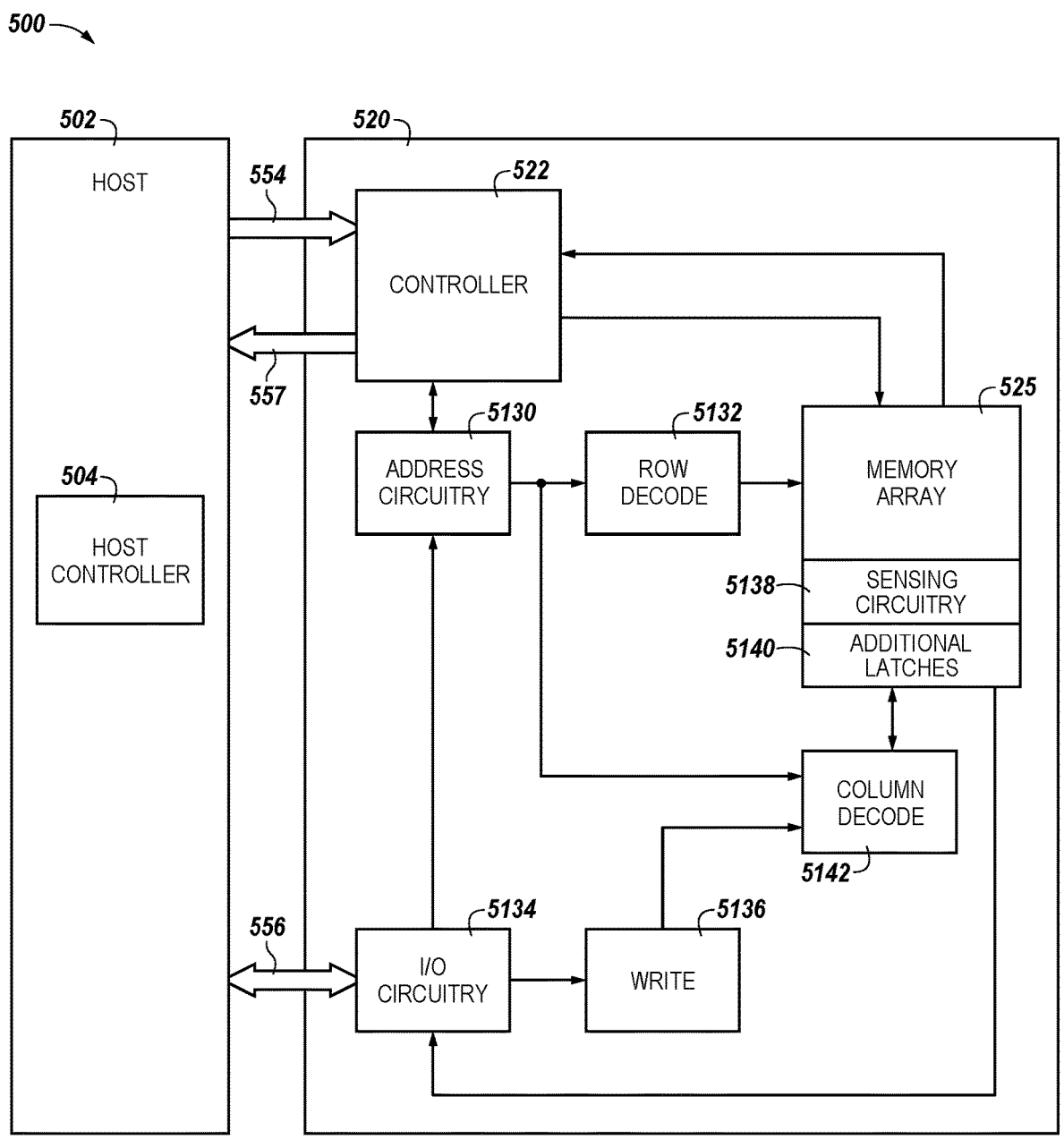
FIG. 5A is a block diagram of an apparatus in the form of a computing system including a memory device with an artificial intelligence (AI) accelerator in accordance with a number of embodiments of the present disclosure.

FIG. 5A is a block diagram of an apparatus in the form of a computing system 500 including a memory device 520 with an artificial intelligence (AI) accelerator, which includes a memory array 525 in accordance with a number of embodiments of the present disclosure. As used herein, a memory device 520, controller 540, memory array 525, sensing circuitry 5138, and/or a number of additional latches 5140 might also be separately considered an "apparatus."

In FIG. 5A, the AI accelerator (e.g., AI accelerator 124 in FIG. 1) can include sensing circuitry 5138 and additional latches 5140, among other components described in association with FIGS. 5A-8B, that are configured to perform operations, such as logic operations, associated with AI operations. As described below in associated with FIGS. 5A-8B, memory devices (e.g., memory device 520) can be configured to perform operations associated with AI operations as part of the AI accelerator.

Figure 5B:
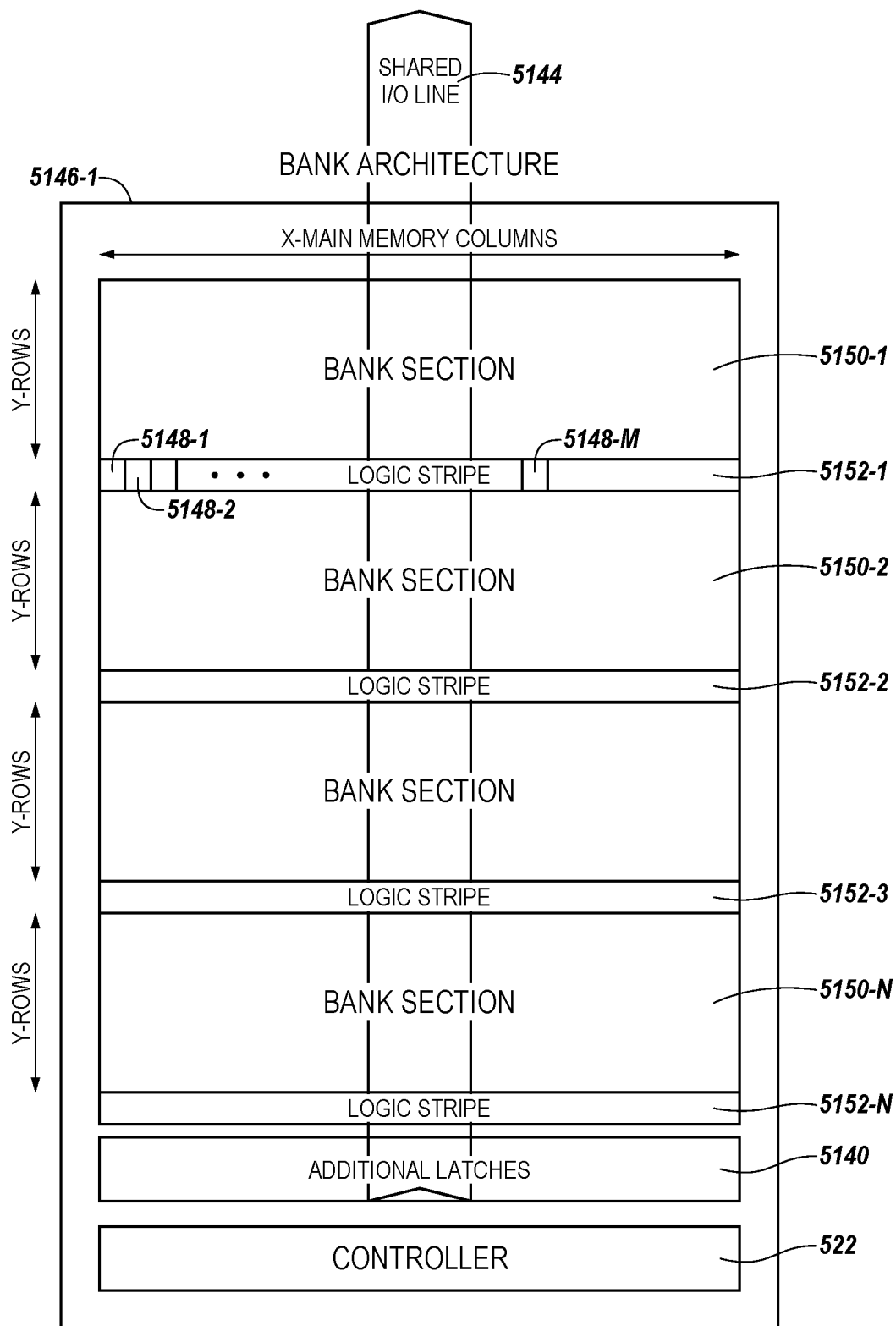
FIG. 5B is block diagram of an apparatus in the form of a computing system including a memory device having a shared input/out (I/O) line in a data path local to bank sections of an array with an artificial intelligence (AI) accelerator in accordance with a number of embodiments of the present disclosure.

As used herein, the additional latches are intended to mean additional functionalities (e.g., amplifiers, select logic) that sense, couple, and/or move (e.g., read, store, cache) data values of memory cells in an array and that are distinct from the plurality of compute components 5148-1, . . . , 5148-M and/or logic stripes 5152-1, . . . , 5152-N in a compute unit in a data path of the plurality of shared I/O lines 5144 shown in FIGS. 5B, 7, 8A and 8B. The logic stripes 5152-1, . . . , 5152-N in a data path of a plurality of shared input/output (I/O) lines 5144 local to the array, as shown in FIGS. 5A and 5B, may be associated with various bank sections 5150-1, . . . , 5150-N of memory cells in the bank 5146-1. The bank 5146-1 may be one of a plurality of banks on the memory device 520.

System 500 in FIG. 5A includes a host 502 coupled (e.g., connected) to the memory device 520. Host 502 can be a host system such as a personal laptop computer, a desktop computer, a digital camera, a smart phone, or a memory card reader, among various other types of hosts. Host 502 can include a system motherboard and/or backplane and can include a number of processing resources (e.g., one or more processors, microprocessors, or some other type of controlling circuitry). The system 500 can include separate integrated circuits or both the host 502 and the memory device 520 can be on the same integrated circuit. The system 500 can be, for instance, a server system and/or a high performance computing (HPC) system and/or a portion thereof. Although the examples shown in FIG. 5A illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 500 has been simplified to focus on features with particular relevance to the present disclosure. The memory array 525 can be a DRAM array, SRAM array, STT RAM array, PCRAM array, TRAM array, RRAM array, NAND flash array, and/or NOR flash array, among other types of arrays. The array 525 can include memory cells arranged in rows coupled by access lines (which may be referred to herein as word lines or select lines) and columns coupled by sense lines (which may be referred to herein as data lines or digit lines). Although a single array 525 is shown in FIG. 5A, embodiments are not so limited. For instance, memory device 520 may include a number of arrays 525 (e.g., a number of banks of DRAM cells, NAND flash cells, etc.).

The memory device 520 can include address circuitry 5525 to latch address signals provided over a data bus 556 (e.g., an I/O bus connected to the host 502) by I/O circuitry 5134 (e.g., provided to external ALU circuitry and/or to DRAM DQs via local I/O lines and global I/O lines). As used herein, DRAM DQs can enable input of data to and/or output of data from a bank (e.g., from and/or to the controller 540 and/or host 502) via a bus (e.g., data bus 556). During a write operation, a voltage (high=1, low=0) can be applied to a DQ (e.g., a pin). This voltage can be translated into an appropriate signal and stored in a selected memory cell. During a read operation, a data value read from a selected memory cell can appear at the DQ once access is complete and the output is enabled (e.g., by the output enable signal being low). At other times, DQs can be in a high impedance state, such that the DQs do not source or sink current and do not present a signal to the system. This also may reduce DQ contention when two or more devices (e.g., banks) share a combined data bus, as described herein. Such DQs are separate and distinct from the plurality of shared I/O lines 5144 (in FIG. 5B) in a data path local to the array 525.

Status and exception information can be provided from the controller 540 of the memory device 520 to a channel controller 504, for example, through an out-of-band (OOB) bus 557, e.g., high-speed interface (HSI), which in turn can be provided from the channel controller 504 to the host 502. The channel controller 504 can include a logic component to allocate a plurality of locations (e.g., controllers for subarrays) in the arrays of each respective bank to store bank commands, application instructions (e.g., for sequences of operations), and arguments (PIM commands) for various banks associated with operations for each of a plurality of memory devices 520. The channel controller 504 can dispatch commands (e.g., PIM commands) to the plurality of memory devices 520 to store those program instructions within a given bank 5146 (FIG. 5B) of a memory device 520.

Address signals are received through address circuitry 5525 and decoded by a row decoder 5132 and a column decoder 5142 to access the memory array 525. Data can be sensed (read) from memory array 525 by sensing voltage and/or current changes on sense lines (digit lines) using a number of sense amplifiers, as described herein, of the sensing circuitry 5138. A sense amplifier can read and latch a page (e.g., a row) of data from the memory array 525. Additional compute circuitry, as described herein, can be coupled to the sensing circuitry 5138 and can be used in combination with the sense amplifiers to sense, store (e.g., cache and/or buffer), perform compute functions (e.g., operations), and/or move data. The I/O circuitry 5134 can be used for bi-directional data communication with host 502 over the data bus 556 (e.g., a 64 bit wide data bus). The write circuitry 5136 can be used to write data to the memory array 525.

Controller 540 (e.g., bank control logic, sequencer and timing circuitry shown in FIG. 5A) can decode signals (e.g., commands) provided by control bus 554 from the host 502. These signals can include chip enable signals, write enable signals, and/or address latch signals that can be used to control operations performed on the memory array 525, including data sense, data store, data movement (e.g., copying, transferring, and/or transporting data values), data write, and/or data erase operations, among other operations. In various embodiments, the controller 540 can be responsible for executing instructions from the host 502 and accessing the memory array 525. The controller 540 can be a state machine, a sequencer, or some other type of controller. The controller 540 can control shifting data (e.g., right or left) in a row of an array (e.g., memory array 525) and execute microcode instructions to perform operations such as compute operations, e.g., AND, OR, NOR, XOR, add, subtract, multiply, divide, etc.

Examples of the sensing circuitry 5138 are described further below (e.g., in FIGS. 6-8B). For instance, in some embodiments, the sensing circuitry 5138 can include a number of sense amplifiers and a number of compute components, which may serve as an accumulator and can be used to perform operations in each subarray (e.g., on data associated with complementary sense lines).

In some embodiments, the sensing circuitry 5138 can be used to perform operations using data stored in memory array 525 as inputs and participate in movement of the data for copy, transfer, transport, writing, logic, and/or storage operations to a different location in the memory array 525 without transferring the data via a sense line address access (e.g., without firing a column decode signal). As such, various compute functions can be performed using, and within, sensing circuitry 5138 rather than (or in association with) being performed by processing resources external to the sensing circuitry 5138 (e.g., by a processor associated with host 502 and/or other processing circuitry, such as ALU circuitry, located on device 520, such as on controller 540 or elsewhere). However, in addition, embodiments according to the present disclosure perform compute functions on data values moved to a plurality of compute components 5148-1, . . . , 5148-M and/or logic stripes 5152-1, . . . , 5152-N in a compute unit from the rows of the array. And as an example, according to embodiments, compute operations may be controlled in the compute unit at speeds of 2 nanoseconds (ns) without having to move the data values back into the rows, as compared to an example time required to fire the rows in the array of 60 nanoseconds (ns).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O circuitry 5134.

In contrast, embodiments according to the present disclosure perform compute functions on data values, moved to a plurality of compute components 5148-1, . . . , 5148-M and/or logic stripes 5152-1, . . . , 5152-N via a plurality of shared I/O lines 5144 from the rows of the array, in a compute unit in a data path local to the array. Additionally, sensing circuitry 5138 may be configured to perform operations on data stored in memory array 525 and store the result back to the memory array 525 without enabling an I/O line (e.g., a local I/O line) coupled to the sensing circuitry 5138. However, once loaded, compute operations may be controlled in the compute unit much faster, e.g., at speeds of 2 nanoseconds (ns), without having to move the data values back into the rows, as compared to an example time required to fire the rows in the array, e.g., 60 nanoseconds (ns). The sensing circuitry 5138 can be formed on pitch with the memory cells of the array. The plurality of compute components 5148-1, . . . , 5148-M and/or logic stripes 5152-1, . . . , 5152-N, associated with the data path of the plurality of shared I/O lines 5144, have a pitch equal to that of the data path and that is a function of a pitch of digit lines to the array of memory cells. For example, the compute component has a pitch that is an integer multiple of the pitch of digit lines to the array of memory cells.

For example, the sensing circuitry 5138 described herein can be formed on a same pitch as a pair of complementary sense lines (e.g., digit lines). As an example, a pair of complementary memory cells may have a cell size with a $6F^2$ pitch (e.g., $3F \times 2F$), where F is a feature size. If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines. Likewise, the compute components 5148-1, . . . , 5148-M and/or logic stripes 5152-1, . . . , 5152-N, associated with the data path of the plurality of shared I/O lines 5144, have a pitch that is a function of the 3F pitch of the complementary sense lines. For example, the compute components 5148-1, . . . , 5148-M and/or logic stripes 5152-1, . . . , 5152-N will have a pitch that is an integer multiple of the 3F pitch of digit lines to the array of memory cells.

By contrast, the circuitry of the processing resource(s) (e.g., a compute engine, such as an ALU) of various prior systems may not conform to pitch rules associated with a memory array. For example, the memory cells of a memory array may have a $4F^2$ or $6F^2$ cell size. As such, the devices (e.g., logic gates) associated with ALU circuitry of previous systems may not be capable of being formed on pitch with the memory cells (e.g., on a same pitch as the sense lines), which can affect chip size and/or memory density, for example. In the context of some computing systems and subsystems (e.g., a central processing unit (CPU)), data may be processed in a location that is not on pitch and/or on chip with memory (e.g., memory cells in the array), as described herein. For example, the data may be processed by a processing resource associated with a host, for instance, rather than on pitch with the memory.

As such, in a number of embodiments, circuitry external to array 525 and sensing circuitry 5138 is not needed to perform compute functions as the sensing circuitry 5138 can perform the appropriate operations to perform such compute functions or can perform such operations in a data path of a plurality of shared I/O lines local to the array without the use of an external processing resource. Therefore, the sensing circuitry 5138 and/or the plurality of compute components 5148-1, . . . , 5148-M and/or logic stripes 5152-1, . . . , 5152-N in a compute unit in a data path of the plurality of shared I/O lines 5144 may be used to complement or to replace, at least to some extent, such an external processing resource (or at least the bandwidth consumption of such an external processing resource). In some embodiments, the sensing circuitry 5138 and/or the plurality of compute components 5148-1, . . . , 5148-M and/or logic stripes 5152-1, . . . , 5152-N in a compute unit in a data path of the plurality of shared I/O lines 5144 may be used to perform operations (e.g., to execute instructions) in addition to operations performed by an external processing resource (e.g., host 502). For instance, host 502 and/or sensing circuitry 5138 may be limited to performing only certain operations and/or a certain number of operations.

Operations described herein can include operations associated with a processing in memory (PIM) capable device. PIM capable device operations can use bit vector based operations. As used herein, the term "bit vector" is intended to mean a physically contiguous number of bits on a bit vector memory device (e.g., a PIM device) stored physically contiguous in a row of an array of memory cells. Thus, as used herein a "bit vector operation" is intended to mean an operation that is performed on a bit vector that is a contiguous portion of virtual address space (e.g., used by a PIM device). For example, a row of virtual address space in the PIM device may have a bit length of 16K bits (e.g., corresponding to 16K complementary pairs of memory cells in a DRAM configuration). Sensing circuitry 5138, as described herein, for such a 16K bit row may include a corresponding 16K processing elements (e.g., compute components, as described herein) formed on pitch with the sense lines selectably coupled to corresponding memory cells in the 16 bit row. A compute component in the PIM device may operate as a one bit processing element (PE) on a single bit of the bit vector of the row of memory cells sensed by the sensing circuitry 5138 (e.g., sensed by and/or stored in a sense amplifier paired with the compute component, as described herein). Similarly, the plurality of compute components 5148-1, . . . , 5148-M and/or logic stripes 5152-1, . . . , 5152-N in a compute unit in a data path of the plurality of shared I/O lines 5144 may operate as a one bit processing element (PE) on a single bit of the bit vector of the row of memory cells sensed in an array.

Enabling an I/O line can include enabling (e.g., turning on, activating) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 5138) can be used to perform operations without enabling column decode lines of the array.

However, the plurality of shared I/O lines 5144 may be enabled in order to load data values to the plurality of compute components 5148-1, . . . , 5148-M and/or logic stripes 5152-1, . . . , 5152-N in a compute unit in a data path of the plurality of shared I/O lines 5144 where compute operations may be controlled much faster. For example, in the plurality of compute components 5148-1, . . . , 5148-M and/or logic stripes 5152-1, . . . , 5152-N in the compute unit, the compute operation may be performed at speeds of 2 nanoseconds (ns). This enhancement of speed can be attributed to not having to move the data values back into the rows with the associated time used in firing the rows in the array, e.g., 60 nanoseconds (ns).

FIG. 5B is block diagram of an apparatus in the form of a computing system including a memory device having a shared input/out (I/O) line in a data path local to bank sections of an array with an artificial intelligence (AI) accelerator in accordance with a number of embodiments of the present disclosure. For example, bank 5146-1 can represent an example bank of a memory device 520. As shown in FIG. 5B, a bank 5146-1 can include a plurality of main memory columns (shown horizontally as X) (e.g., 16,384 columns in an example DRAM bank). Additionally, the bank 5146-1 may be divided up into bank sections (e.g., quadrants of 32 subarrays), 5150-1, 5150-2, . . . , 5150-N. Each bank section may be associated with a plurality of compute components 5148-1, . . . , 5148-M in logic stripes 5152-1, . . . , 5152-N in a compute unit in a data path of the plurality of shared I/O lines 5144. Each of the of the bank sections 5150-1, . . . , 5150-N can include a plurality of rows (shown vertically as Y) (e.g., each section may be a quadrant that includes 32 subarrays that each may include 512 rows in an example DRAM bank). Example embodiments are not limited to the example horizontal and/or vertical orientation of columns and rows described here or the example numbers thereof.

As shown in FIG. 5B, the bank 5146-1 can be divided into a plurality of bank sections 5150-1, . . . , 5150-N. Each bank sections can have a plurality of compute components 5148-1, . . . , 5148-M and logic stripes 5152-1, . . . , 5152-N in a compute unit in a data path of the plurality of shared I/O lines 5144 associated therewith. The bank 5146-1 can include a controller 540 to direct operations on data values loaded to the plurality of compute components 5148-1, . . . , 5148-M in logic stripes 5152-1, . . . , 5152-N in a compute unit in a data path of the plurality of shared I/O lines 5144.

Figure 6:
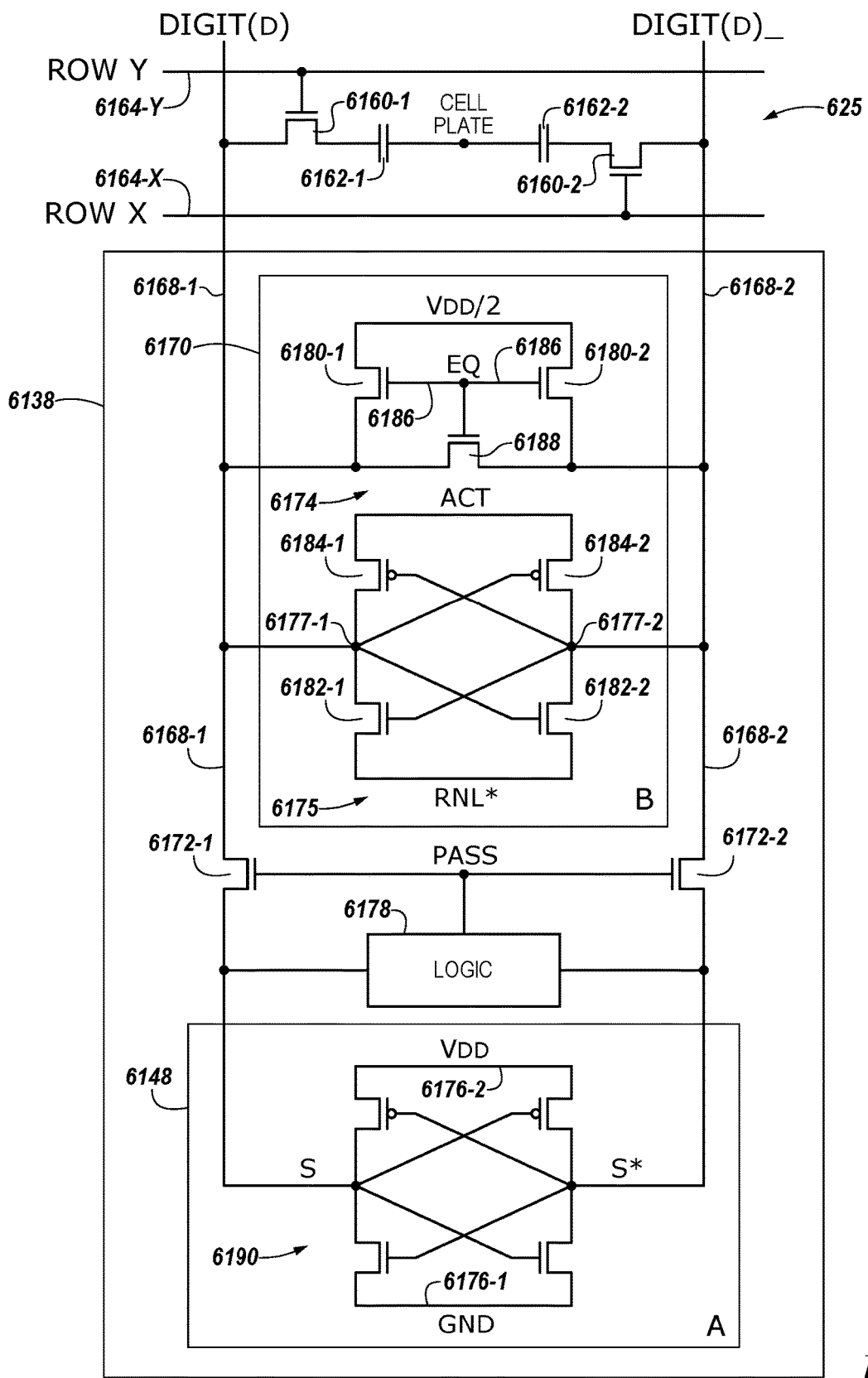
FIG. 6 is a schematic diagram illustrating sensing circuitry of a memory device, the sensing circuitry including a compute component, in accordance with a number of embodiments of the present disclosure.

FIG. 6 is a schematic diagram illustrating sensing circuitry 6138 in accordance with a number of embodiments of the present disclosure. The sensing circuitry 6138 can correspond to sensing circuitry 5138 shown in FIG. 5A.

As shown in the example embodiment of FIG. 6, a memory cell can include a storage element (e.g., capacitor) and an access device (e.g., transistor). For example, a first memory cell can include transistor 6160-1 and capacitor 6162-1, and a second memory cell can include transistor 6160-2 and capacitor 6162-2, etc. In this embodiment, the memory array 625 is a DRAM array of 1T1B (one transistor one capacitor) memory cells, although other embodiments of configurations can be used (e.g., 2T2C with two transistors and two capacitors per memory cell). In a number of embodiments, the memory cells may be destructive read memory cells (e.g., reading the data stored in the cell destroys the data such that the data originally stored in the cell is refreshed after being read).

The cells of the memory array 625 can be arranged in rows coupled by access (word) lines 6164-X (Row X), 6164-Y (Row Y), etc., and columns coupled by pairs of complementary sense lines (e.g., digit lines DIGIT(D) and DIGIT(D)_ shown in FIG. 6). The individual sense lines corresponding to each pair of complementary sense lines can also be referred to as digit lines 6168-1 for DIGIT (D) and 6168-2 for DIGIT (D)_, respectively, or corresponding reference numbers in FIGS. 7 and 8A-8B. Although only one pair of complementary digit lines are shown in FIG. 6, embodiments of the present disclosure are not so limited, and an array of memory cells can include additional columns of memory cells and digit lines (e.g., 4,096, 8,192, 16,384, etc.).

Although rows and columns are illustrated as orthogonally oriented in a plane, embodiments are not so limited. For example, the rows and columns may be oriented relative to each other in any feasible three-dimensional configuration. For example, the rows and columns may be oriented at any angle relative to each other, may be oriented in a substantially horizontal plane or a substantially vertical plane, and/or may be oriented in a folded topology, among other possible three-dimensional configurations.

Memory cells can be coupled to different digit lines and word lines. For example, a first source/drain region of a transistor 6160-1 can be coupled to digit line 6168-1 (D), a second source/drain region of transistor 6160-1 can be coupled to capacitor 6162-1, and a gate of a transistor 6160-1 can be coupled to word line 6164-Y. A first source/drain region of a transistor 6160-2 can be coupled to digit line 6168-2 (D)_, a second source/drain region of transistor 6160-2 can be coupled to capacitor 6162-2, and a gate of a transistor 6160-2 can be coupled to word line 6164-X. A cell plate, as shown in FIG. 6, can be coupled to each of capacitors 6162-1 and 6162-2. The cell plate can be a common node to which a reference voltage (e.g., ground) can be applied in various memory array configurations.

The memory array 625 is configured to couple to sensing circuitry 6138 in accordance with a number of embodiments of the present disclosure. In this embodiment, the sensing circuitry 6138 comprises a sense amplifier 6170 and a compute component 6148 corresponding to respective columns of memory cells (e.g., coupled to respective pairs of complementary digit lines). The sense amplifier 6170 can be coupled to the pair of complementary digit lines 6168-1 and 6168-2. The compute component 6148 can be coupled to the sense amplifier 6170 via pass gates 6172-1 and 6172-2. The gates of the pass gates 6172-1 and 6172-2 can be coupled to operation selection logic 6178.

The operation selection logic 6178 can be configured to include pass gate logic for controlling pass gates that couple the pair of complementary digit lines un-transposed between the sense amplifier 6170 and the compute component 6148 and swap gate logic for controlling swap gates that couple the pair of complementary digit lines transposed between the sense amplifier 6170 and the compute component 6148. The operation selection logic 6178 can also be coupled to the pair of complementary digit lines 6168-1 and 6168-2. The operation selection logic 6178 can be configured to control continuity of pass gates 6172-1 and 6172-2 based on a selected operation.

The sense amplifier 6170 can be operated to determine a data value (e.g., logic state) stored in a selected memory cell. The sense amplifier 6170 can comprise a cross coupled latch, which can be referred to herein as a primary latch. In the example illustrated in FIG. 2, the circuitry corresponding to sense amplifier 6170 comprises a latch 6175 including four transistors coupled to a pair of complementary digit lines D 6168-1 and (D)_ 6168-2. However, embodiments are not limited to this example. The latch 6175 can be a cross coupled latch (e.g., gates of a pair of transistors) such as n-channel transistors (e.g., NMOS transistors) 6182-1 and 6182-2 are cross coupled with the gates of another pair of transistors, such as p-channel transistors (e.g., PMOS transistors) 6184-1 and 6184-2). The cross coupled latch 6175 comprising transistors 6182-1, 6182-2, 6184-1, and 6184-2 can be referred to as the primary latch.

In operation, when a memory cell is being sensed (e.g., read), the voltage on one of the digit lines 6168-1 (D) or 6168-2 (D)_ will be slightly greater than the voltage on the other one of digit lines 6168-1 (D) or 6168-2 (D)_. An ACT signal and an RNL* signal can be driven low to enable (e.g., fire) the sense amplifier 6170. The digit lines 6168-1 (D) or 6168-2 (D)_ having the lower voltage will turn on one of the PMOS transistor 6184-1 or 6184-2 to a greater extent than the other of PMOS transistor 6184-1 or 6184-2, thereby driving high the digit line 6168-1 (D) or 6168-2 (D)_ having the higher voltage to a greater extent than the other digit line 6168-1 (D) or 6168-2 (D)_ is driven high.

Similarly, the digit line 6168-1 (D) or 6168-2 (D)_ having the higher voltage will turn on one of the NMOS transistor 6182-1 or 6182-2 to a greater extent than the other of the NMOS transistor 6182-1 or 6182-2, thereby driving low the digit line 6168-1 (D) or 6168-2 (D)_ having the lower voltage to a greater extent than the other digit line 6168-1 (D) or 6168-2 (D)_ is driven low. As a result, after a short delay, the digit line 6168-1 (D) or 6168-2 (D)_ having the slightly greater voltage is driven to the voltage of the supply voltage $V_{CC}$ through a source transistor, and the other digit line 6168-1 (D) or 6168-2 (D)_ is driven to the voltage of the reference voltage (e.g., ground) through a sink transistor. Therefore, the cross coupled NMOS transistors 6182-1 and 6182-2 and PMOS transistors 6184-1 and 6184-2 serve as a sense amplifier pair, which amplify the differential voltage on the digit lines 6168-1 (D) and 6168-2 (D)_ and operate to latch a data value sensed from the selected memory cell on nodes 6177-1 and/or 6177-2.

Embodiments are not limited to the sense amplifier 6170 configuration illustrated in FIG. 6. As an example, the sense amplifier 6170 can be a current-mode sense amplifier and a single-ended sense amplifier (e.g., sense amplifier coupled to one digit line). Also, embodiments of the present disclosure are not limited to a folded digit line architecture such as that shown in FIG. 6.

The sense amplifier 6170 can, in conjunction with the compute component 6148, be operated to perform various operations using data from an array as input. In a number of embodiments, the result of an operation can be stored back to the array without transferring the data via a digit line address access (e.g., without firing a column decode signal such that data is transferred to circuitry external from the array and sensing circuitry via local I/O lines). As such, a number of embodiments of the present disclosure can enable performing operations and compute functions associated therewith using less power than various previous approaches. Additionally, since a number of embodiments eliminate the need to transfer data across local and global I/O lines in order to perform compute functions (e.g., between memory and discrete processor), a number of embodiments can enable an increased (e.g., faster) processing capability as compared to previous approaches.

The sense amplifier 6170 can further include equilibration circuitry 6174, which can be configured to equilibrate the digit lines 6168-1 (D) and 6168-2 (D)_. In this example, the equilibration circuitry 6174 comprises a transistor 6188 coupled between digit lines 6168-1 (D) and 6168-2 (D)_. The equilibration circuitry 6174 also comprises transistors 6180-1 and 6180-2 each having a first source/drain region coupled to an equilibration voltage (e.g., $V_{DD}/2$), where $V_{DD}$ is a supply voltage associated with the array. A second source/drain region of transistor 6180-1 can be coupled digit line 6168-1 (D), and a second source/drain region of transistor 6180-2 can be coupled digit line 6168-2 (D)_. Gates of transistors 6188, 6180-1, and 6180-2 can be coupled together, and to an equilibration (EQ) control signal line 6186. As such, activating EQ enables the transistors 6188, 6180-1, and 6180-2, which effectively shorts digit lines 6168-1 (D) and 6168-2 (D)_ together and to the equilibration voltage (e.g., $V_{CC}/2$).

Although FIG. 6 shows sense amplifier 6170 comprising the equilibration circuitry 6174, embodiments are not so limited, and the equilibration circuitry 6174 may be implemented discretely from the sense amplifier 6170, implemented in a different configuration than that shown in FIG. 6, or not implemented at all.

As described further below, in a number of embodiments, the sensing circuitry 6138 (e.g., sense amplifier 6170 and compute component 6148) can be operated to perform a selected operation and initially store the result in one of the sense amplifier 6170 or the compute component 6148 without transferring data from the sensing circuitry via a local or global I/O line (e.g., without performing a sense line address access via activation of a column decode signal, for instance).

Figure 8A:
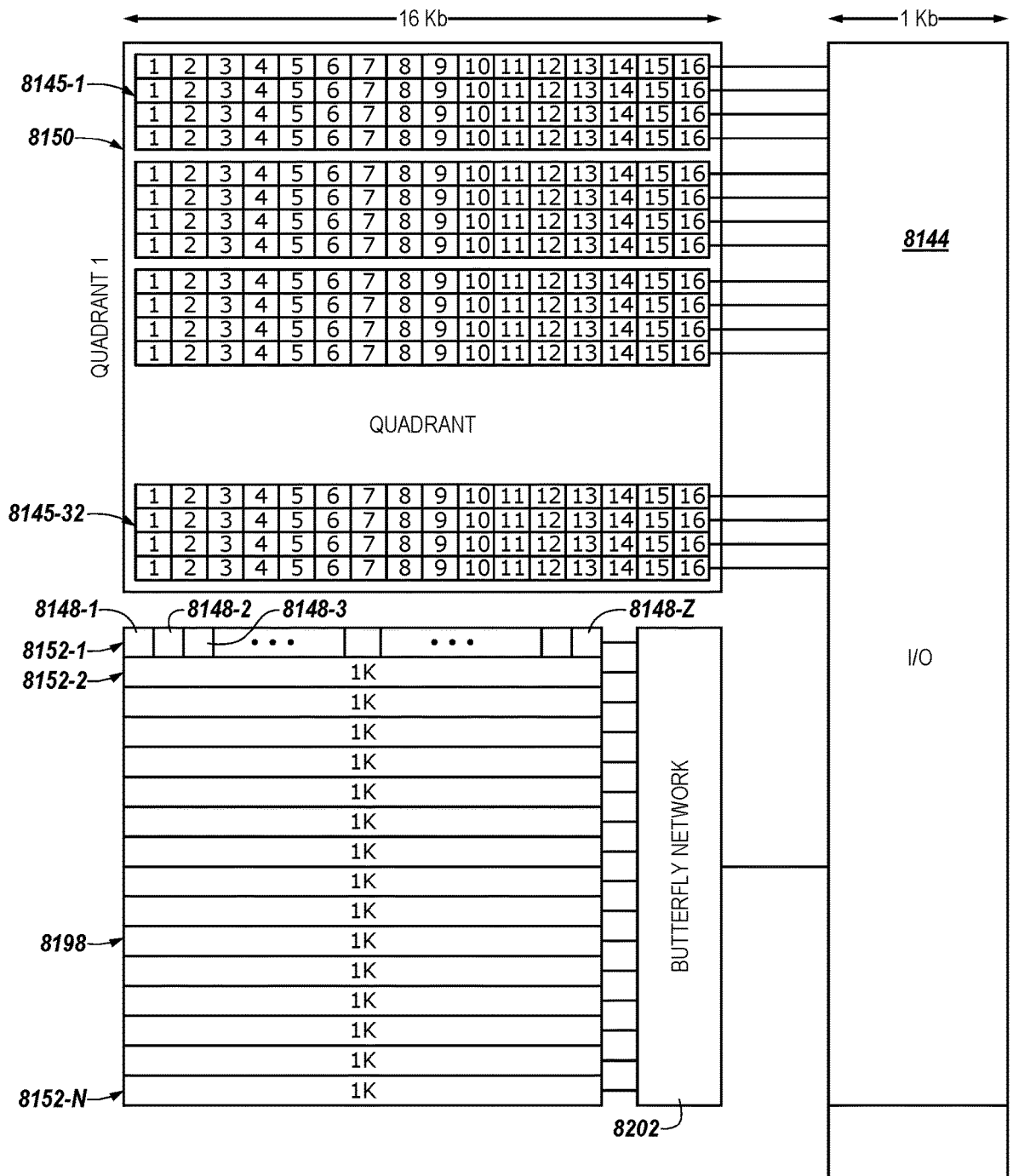
FIG. 8A is a block diagram example illustrating a plurality of sections of an array coupled to a compute unit, having a plurality of logic stripes, by a plurality of shared I/O lines in a data path local to the array.
Figure 8B:
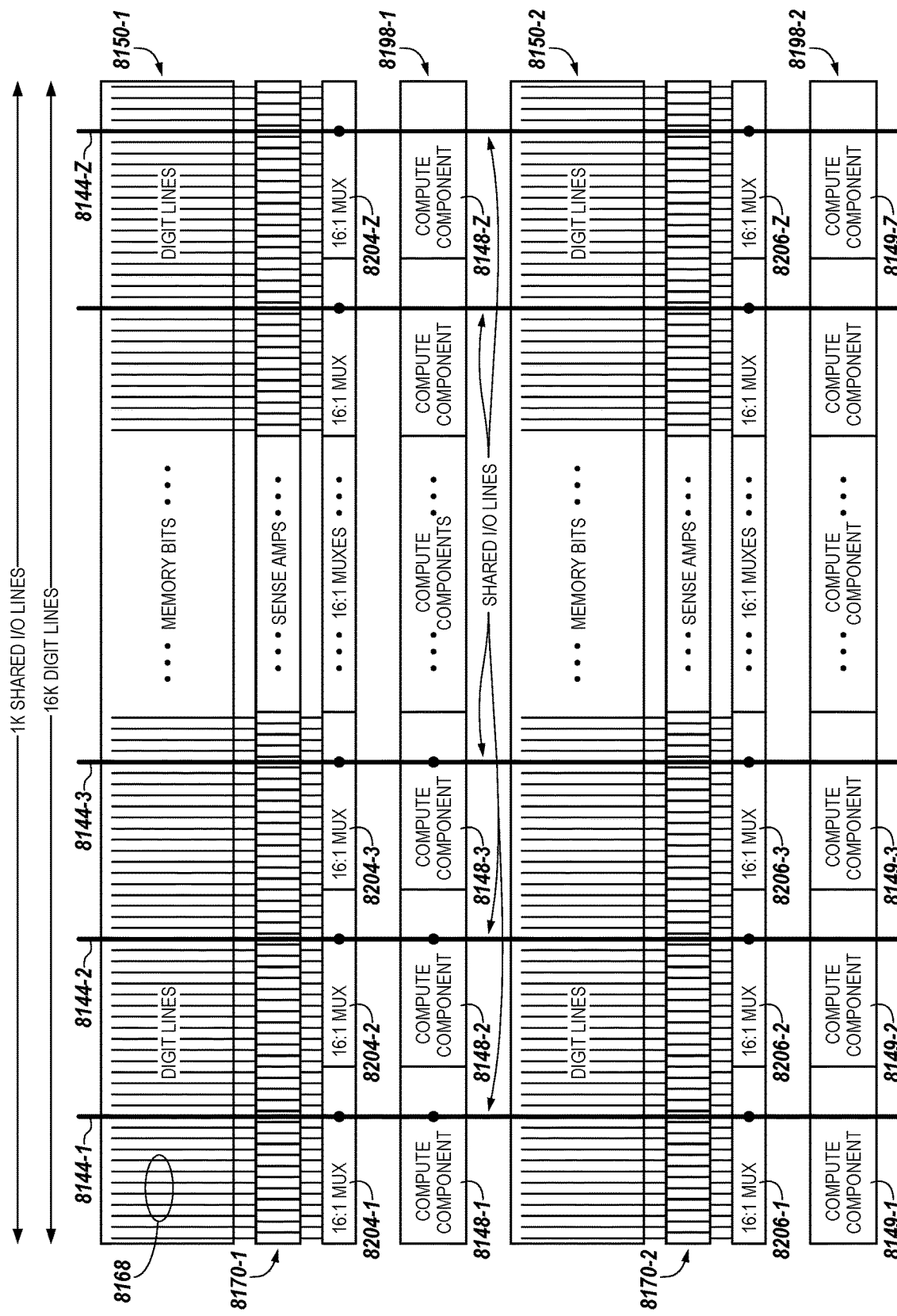
FIG. 8B is a block diagram example illustrating a plurality of arrays coupled to a plurality of compute components in a compute unit by a plurality of shared I/O lines in a data path local to the arrays where the compute component has a pitch equal to that of the data path of a shared I/O line and which is a multiple of a pitch of the digit lines to the array.

However, further to embodiments described herein, sensing circuitry 6138 having sense amplifiers, and which in some embodiments may also include compute components as shown in FIG. 6, can also couple the memory cells from a multiplexed column of memory cells in an array to the compute components 8148-1, . . . , 8148-M and/or logic stripes 8152-1, . . . , 8152-N in a compute unit 8198 in the data path of the plurality of shared I/O lines 8144 local to the array as discussed in connection with FIGS. 8A and 8B. In this manner, the compute components 8148-1, . . . , 8148-M and/or logic stripes 8152-1, . . . , 8152-N may be indirectly coupled to the memory cells of a column through the plurality of shared I/O lines 8144 via select logic (discussed in connection with FIGS. 8A and 8B).

Performance of operations (e.g., Boolean logical operations involving data values) is fundamental and commonly used. Boolean logical operations are used in many higher level operations. Consequently, speed and/or power efficiencies that can be realized with improved operations, can translate into speed and/or power efficiencies of higher order functionalities.

As shown in FIG. 6, the compute component 6148 can also comprise a latch, which can be referred to herein as a secondary latch 6190. The secondary latch 6190 can be configured and operated in a manner similar to that described above with respect to the primary latch 6175, with the exception that the pair of cross coupled p-channel transistors (e.g., PMOS transistors) included in the secondary latch can have their respective sources coupled to a supply voltage 6176-2 (e.g., $V_{DD}$), and the pair of cross coupled n-channel transistors (e.g., NMOS transistors) of the secondary latch can have their respective sources selectively coupled to a reference voltage 6176-1 (e.g., ground), such that the secondary latch is continuously enabled. The configuration of the compute component 6148 is not limited to that shown in FIG. 6, and various other embodiments are feasible.

As described herein, a memory device (e.g., 520 in FIG. 5A) can be configured to couple to a host (e.g., 502) via a data bus (e.g., 556) and a control bus (e.g., 554). A bank 5146 in the memory device 520 can include a plurality of bank sections (5150-1, . . . , 5150-N in FIG. 5B) of memory cells. The bank 5146 can include sensing circuitry (e.g., 5138 in FIG. 5A and corresponding reference numbers in FIGS. 6 and 7) coupled to the plurality of arrays via a plurality of columns (FIG. 5B) of the memory cells. The sensing circuitry can include a sense amplifier and a compute component (e.g., 6170 and 6148, respectively, in FIG. 6) coupled to each of the columns.

Each bank section 5150 can be associated with a plurality of logic stripes (e.g., 5152-0, 5152-1, . . . , 5152-N-1 in FIG. 5B) in a compute unit in a data path of a plurality of shared I/O lines (5144 in FIG. 5B) local to array 625. A controller (e.g., 540 in FIGS. 5A-5B) coupled to the bank can be configured to direct, as described herein, movement of data values to a compute component 8148 (Figure A) in a logic stripe 8152 (FIG. 8A) in a compute unit 7198/8198 (FIGS. 7 and 8A-8B) in a data path of a shared I/O line 7144/8144 (FIGS. 7 and 4) local to the array 8A-8B.

Figure 7:
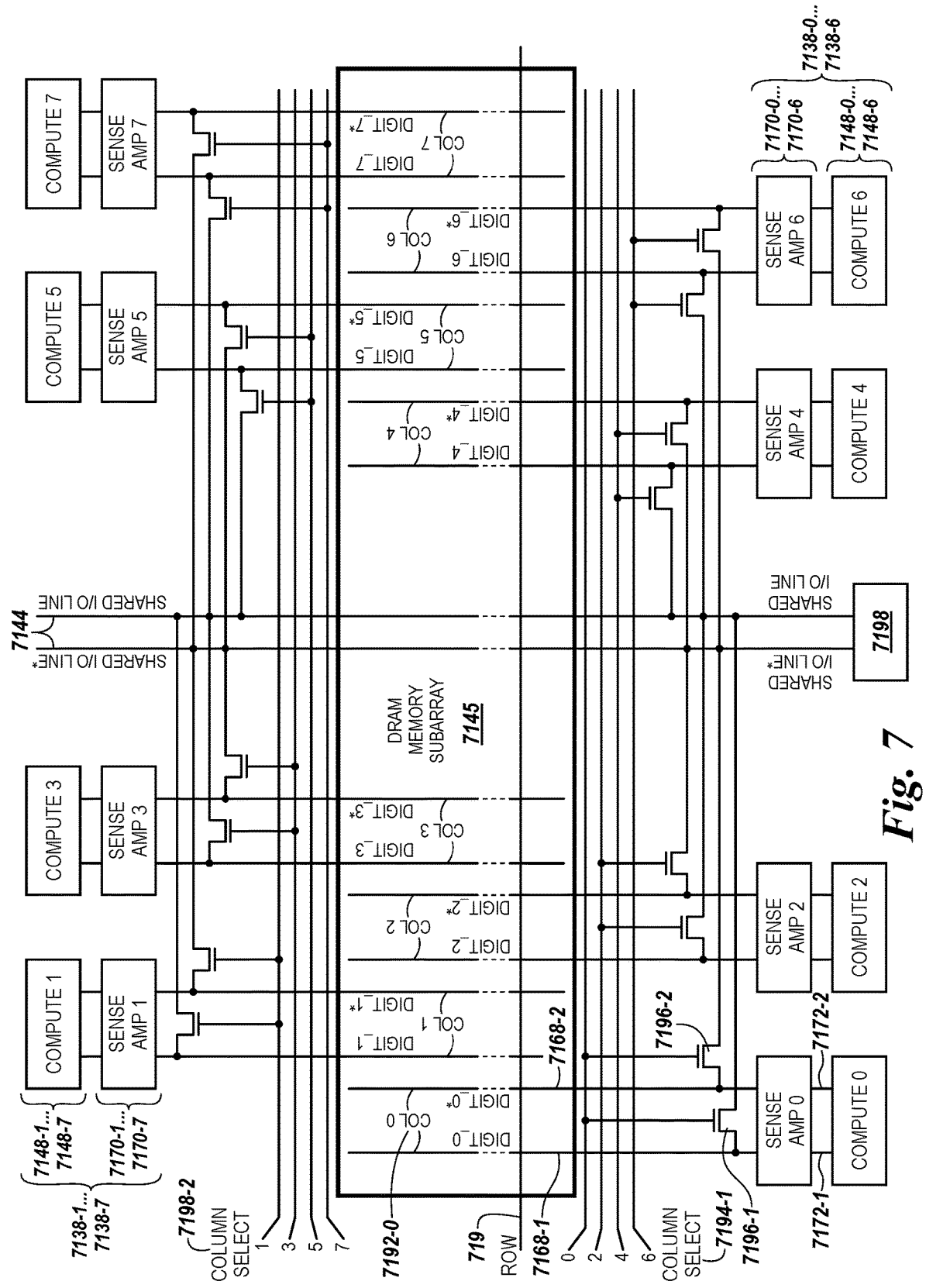
FIG. 7 is a schematic diagram illustrating circuitry for a plurality of shared I/O lines in a data path of an array in accordance with a number of embodiments of the present disclosure.

The memory device can include a logic stripe (e.g., 5152 in FIG. 5B and 8152 in FIG. 8A) having a plurality of compute components (e.g., 8148-1, . . . , 8148-Z, respectively in FIG. 8A) that can correspond to a number of the plurality of columns (FIG. 1AB) of the memory cells. As discussed further in connection with FIG. 6, the number of sense amplifiers 6170 and/or compute components 6148 in sensing circuitry 6138 can be selectably coupled (e.g., via column select circuitry 7194-1 and 7194-2 in FIG. 7) to a plurality of shared I/O lines 7144 (FIG. 7). The column select circuitry can be configured to selectably sense data in a particular column of memory cells of an array by being selectably coupled to a plurality of (e.g., four, eight, and sixteen, among other possibilities) sense amplifiers and/or compute components.

In some embodiments, a number of a plurality of logic stripes (e.g., 5152-1, . . . , 5152-N in FIG. 5B) in a bank can correspond to a number of bank sections 5150-1, . . . , 5150-N in FIG. 5B (e.g., a quadrant having a plurality of subarrays) in the bank. A logic stripe can include a plurality of compute components 8148-1, . . . , 8148-Z (FIG. 8A) in a data path of a shared I/O local 8144 (FIG. 8A) to the array 625 that are like compute components 6148 shown in FIG. 6. As will be shown in FIG. 7, data values sensed from a row of the array can be moved in parallel by column select logic via a plurality of shared I/O lines 7144 (FIG. 7) to a plurality of compute components 8148 (FIG. 8A) in a compute unit 7198 (FIG. 7) a data path of the plurality of shared I/O lines 7144 (FIG. 7). In some embodiments, the amount of data can correspond to at least a thousand bit width of the plurality of shared I/O lines.

As described herein, the array of memory cells can include an implementation of DRAM memory cells where the controller is configured, in response to a command, to move (e.g., copy, transfer, and/or transport) data from the source location to the destination location via a shared I/O line. In various embodiments, the source location can be in a first bank and the destination location can be in a compute unit 7198 (FIG. 7) in a data path of the shared I/O lines 7144 (FIG. 7) local to the array 625.

As described in FIG. 7, the apparatus can be configured to move (e.g., copy, transfer, and/or transport) data from a source location, including a particular row (e.g., 719 in FIG. 7) and column address associated with a first number of sense amplifiers and compute components to a shared I/O line (e.g., 7144 in FIG. 7). In addition, the apparatus can be configured to move the data to a destination location, including a particular logic stripe 8152 (FIG. 8A) associated with a compute unit 8198 (FIG. 8A) in a data path of the shared I/O line 8144 (FIG. 8A). As the reader will appreciate, each shared I/O line 7144 (FIG. 7) can actually include a complementary pair of shared I/O lines (e.g., shared I/O line and shared I/O line* in FIG. 7). In some embodiments described herein, 2048 shared I/O lines (e.g., complementary pairs of shared I/O lines) can be configured as a 2048 bit wide shared I/O line. In some embodiments described herein, 1024 shared I/O lines (e.g., complementary pairs of shared I/O lines) can be configured as a 1024 bit wide shared I/O line.

FIG. 7 is a schematic diagram illustrating circuitry for data movement in a memory device in accordance with a number of embodiments of the present disclosure. FIG. 7 shows eight sense amplifiers (e.g., sense amplifiers 0, 1, . . . , 7 shown at 7170-0, 7170-1, . . . , 7170-7, respectively) each coupled to a respective pair of complementary shared I/O lines 7144 (e.g., shared I/O line and shared I/O line*). FIG. 7 also shows eight compute components (e.g., compute components 0, 1, . . . , 7 shown at 7148-0, 7148-1, . . . , 7148-7) each coupled to a respective sense amplifier (e.g., as shown for sense amplifier 0 at 7170-0) via respective pass gates 7172-1 and 7172-2 and digit lines 7168-1 and 7168-2. For example, the pass gates can be connected as shown in FIG. 2 and can be controlled by an operation selection signal, Pass. For example, an output of the selection logic can be coupled to the gates of the pass gates 7172-1 and 7172-2 and digit lines 7168-1 and 7168-2. Corresponding pairs of the sense amplifiers and compute components can contribute to formation of the sensing circuitry indicated at 7138-0, 7138-1, . . . , 7138-7.

Data values present on the pair of complementary digit lines 7168-1 and 7168-2 can be loaded into the compute component 7148-0 as described in connection with FIG. 6. For example, when the pass gates 7172-1 and 7172-2 are enabled, data values on the pair of complementary digit lines 7168-1 and 7168-2 can be passed from the sense amplifiers to the compute component (e.g., 7170-0 to 7148-0). The data values on the pair of complementary digit lines 7168-1 and 7168-2 can be the data value stored in the sense amplifier 7170-0 when the sense amplifier is fired.

The sense amplifiers 7170-0, 7170-1, . . . , 7170-7 in FIG. 3 can each correspond to sense amplifier 6170 shown in FIG. 6. The compute components 7148-0, 7148-1, . . . , 7148-7 shown in FIG. 3 can each correspond to compute component 6148 shown in FIG. 6. A combination of one sense amplifier with one compute component can contribute to the sensing circuitry (e.g., 7138-0, 7138-1, . . . , 7138-7) of a portion of a DRAM memory subarray 7145 coupled to a shared I/O line 7144 shared by a number of logic stripes in a data path of the shared I/O lines 7144.

The configurations of embodiments illustrated in FIG. 7 are shown for purposes of clarity and are not limited to these configurations. For instance, the configuration illustrated in FIG. 7 for the sense amplifiers 7170-0, 7170-1, . . . , 7170-7 in combination with the compute components 7148-0, 7148-1, . . . , 7148-7 and the shared I/O line 7144 is not limited to half the combination of the sense amplifiers 7170-0, 7170-1, . . . , 7170-7 with the compute components 7148-0, 7148-1, . . . , 7148-7 of the sensing circuitry being formed above the columns 7192 of memory cells (not shown) and half being formed below the columns 7192 of memory cells. Nor are the number of such combinations of the sense amplifiers with the compute components forming the sensing circuitry configured to couple to a shared I/O line limited to eight. In addition, the configuration of the shared I/O line 7144 is not limited to being split into two for separately coupling each of the two sets of complementary digit lines 7168-1 and 7168-2, nor is the positioning of the shared I/O line 7144 limited to being in the middle of the combination of the sense amplifiers and the compute components forming the sensing circuitry (e.g., rather than being at either end of the combination of the sense amplifiers and the compute components).

The circuitry illustrated in FIG. 3 also shows column select circuitry 7194-1 and 7194-2 that is configured to implement data movement operations with respect to particular columns 7192 of a subarray 7145, the complementary digit lines 7168-1 and 7168-2 associated therewith, and the shared I/O line 7144 (e.g., as directed by the controller 540 shown in FIGS. 5A-6B). For example, column select circuitry 7194-1 has select lines 0, 2, 4, and 6 that are configured to couple with corresponding columns, such as column 0 (332-0), column 2, column 4, and column 6. Column select circuitry 7194-2 has select lines 1, 3, 5, and 7 that are configured to couple with corresponding columns, such as column 1, column 3, column 5, and column 7. The column select circuitry 7194 described in connection with FIG. 7 can, in various embodiments, represent at least a portion of the functionality embodied by and contained in multiplexers, e.g., an eight (8) way multiplexer, sixteen (16) way multiplexer, etc.

Controller 740 can be coupled to column select circuitry 7194 to control select lines (e.g., select line 0) to access data values stored in the sense amplifiers, compute components, and/or present on the pair of complementary digit lines (e.g., 7168-1 and 7168-2 when selection transistors 7196-1 and 7196-2 are activated via signals from select line 0). Activating the selection transistors 7196-1 and 7196-2 (e.g., as directed by the controller 540) enables coupling of sense amplifier 7170-0, compute component 7148-0, and/or complementary digit lines 7168-1 and 7168-2 of column 0 (7192-0) to move data values on digit line 0 and digit line 0* to shared I/O line 7144. For example, the moved data values may be data values from a particular row 319 stored (cached) in sense amplifier 7170-0 and/or compute component 7148-0. Data values from each of columns 0 through 7 can similarly be selected by controller 540 activating the appropriate selection transistors.

Moreover, enabling (e.g., activating) the selection transistors (e.g., selection transistors 7196-1 and 7196-2) can enable a particular sense amplifier and/or compute component (e.g., 7170-0 and/or 7148-0, respectively) to be coupled with a shared I/O line 7144 such that data values stored by an amplifier and/or compute component can be moved to (e.g., placed on and/or transferred to) the shared I/O line 7144. In some embodiments, one column at a time is selected (e.g., column 7192-0) to be coupled to a particular shared I/O line 7144 to move (e.g., copy, transfer, and/or transport) the stored data values. In the example configuration of FIG. 7, the shared I/O line 7144 is illustrated as a shared, differential I/O line pair (e.g., shared I/O line and shared I/O line*). Hence, selection of column 0 (7192-0) could yield two data values (e.g., two bits with values of 0 and/or 1) from a row (e.g., row 719) and/or as stored in the sense amplifier and/or compute component associated with complementary digit lines 7168-1 and 7168-2. These data values could be input in parallel to each shared, differential I/O pair (e.g., shared I/O and shared I/O*) of the shared differential I/O line 7144.

FIG. 8A is a block diagram illustrating one of a plurality of sections 8150 of an array 525 (FIG. 5A) coupled to a compute unit 8198, having a plurality of logic stripes 8152-1, . . . , 8152-N, by a plurality of shared I/O lines 8144 in a data path local to the array 525. In the example embodiment of FIG. 8A a bank section 8150 (e.g., bank quadrant) is shown having a plurality of subarrays 8145-1, . . . , 8145-32. In FIG. 8A, thirty-two (32) subarrays are illustrated in a bank quadrant 8150. However, embodiments are not limited to this example. This example shows a bank section having 16K columns which are multiplexed by sixteen (16) to the shared I/O lines 8144. Thus, 16K columns are multiplexed to 1K shared I/O lines 8144 such that every 16 columns can provide a data value that can be moved to the compute unit 8198 as a group of 1024 (1K) bits in parallel. Here, the shared I/O lines 8144 provide a 1K bit wide data path to the compute unit 8198.

In the example of FIG. 8A, each logic stripe 8152-1, . . . , 8152-N has a plurality of compute components 8148-1, . . . , 8148-Z as the same have been described herein in connection with the sensing circuitry 6138 of FIG. 6. In some embodiments, each of the plurality of logic stripes 8152-1, . . . , 8152-N is configured to perform a compute function using the plurality of compute components 8148-1, . . . , 8148-Z. In some embodiments, each of the plurality of logic stripes 8152-1, . . . , 8152-Z can perform a different logical operation using the plurality of compute components 8148-1, . . . , 8148-Z. For example, in some embodiments at least one of the plurality of logic stripes 8152-1, . . . , 8152-Z can be configured to perform a long shift accelerator operation, e.g., eight (8) sixty-four (64) bit barrel shifter operation. This example could also provide a partial reorder in eight (8) bit chunks and could support a gather/scatter operation, in chunks of 256 bits with an 8 bit cross bar. In another example, in some embodiments at least one of the plurality of logic stripes 8152-1, . . . , 8152-Z can be configured to perform Kogge-Stone acceleration to generate a partial carry look ahead to accelerate a horizontal add. In another example, in some embodiments at least one of the plurality of logic stripes 8152-1, . . . , 8152-Z can be configured to perform "chunk" math acceleration. This example could provide vertical mode acceleration in small groups of bits (e.g., 4 or 8 bit chunks). In another example, in some embodiments the plurality of logic stripes 8152-1, . . . , 8152-Z can be configured to function as an explicit mask register to implement Boolean operations as would be used by a compiler. As used herein, a "chunk" is intended to reference a smaller bit length than an addressed row of data, e.g., a 256 bit chunk (within a 128 byte addressable row) may be addressed to match a bit width to a particular interface. This may be desirable to match a 256 bit interface of a 16K+ column memory array.

According to embodiments, the controller 540 (FIG. 5A) associated with the bank section can execute microcode instructions to direct movement of the 1K bit data values in parallel from each multiplexed column in connection with a particular accessed row among the plurality of subarrays 8145-1, . . . , 8145-32 to a particular compute component 8148-1, . . . , 8148-Z of a particular logic stripe 8152-1, . . . , 8152-N in the compute unit 8198.

According to some embodiments, a butterfly network 8202 can be used to connect the 1K bit data values to a respective one of the plurality of compute components 8148-1, . . . , 8148-Z in a respective one of the plurality of logic stripes 8152-1, . . . , 8152-N. By way of example, and not by way of limitation, 1K bits of data values can be moved in parallel to a logic strip associate with each of the 32 subarrays 8145-1, . . . , 8145-32 in each of 4 quadrants to a bank section 8150. In this example, 128 logic stripes 8152-1, . . . , 8152-N having 1K compute components 8148-1, . . . , 8148-Z each can be included in the compute unit 8198. Data values loaded to the plurality of compute components 8148-1, . . . , 8148-Z in the logic stripes 8152-1, . . . , 8152-N of the compute unit 8198 can be operated on according to microcode instructions from the controller 540 (FIG. 1A) to perform operations, e.g., AND, OR, NOR, XOR, add, subtract, multiply, divide, etc., on the data values as the same have been described herein in connection with the sensing circuitry 6138 of FIG. 6. As noted above, once the data values are loaded to the compute unit 8198, compute operations may be controlled in the compute unit much faster, e.g., at speeds of approximately 2 nanoseconds (ns), according to microcode instructions executed by the controller 540 (FIG. 5A) without having to move the data values back into the rows of the array 525 (FIG. 5A). For example, compute operations may be performed using the compute unit 8198 at a much faster speed as compared to an example time, e.g., approximately 60 nanoseconds (ns), that may be required to fire and access rows in the array 525 (FIG. 5A).

In the example embodiment of FIG. 8A, the plurality of compute components 8148-1, . . . , 8148-Z and/or logic stripes 8152-1, . . . , 8152-N in the compute unit 8198, in the data path of the plurality of shared I/O lines 8144, have a pitch equal to that of the data path of a shared I/O line. According to embodiments, the pitch of the data path is a function, e.g., multiple (2×, 4×, etc.), of a pitch of digit lines to the array 525 (FIG. 5A) of memory cells. For example, the plurality of compute components 8148-1, . . . , 8148-Z and/or logic stripes 8152-1, . . . , 8152-N have a pitch that is an integer multiple of the pitch of digit lines to the array of memory cells.

FIG. 8B is a block diagram example illustrating a plurality of arrays coupled to a plurality of compute components in a compute unit by a plurality of shared I/O lines in a data path local to the arrays where the compute component has a pitch equal to that of the data path of a shared I/O line and which is a multiple of a pitch of the digit lines to the array. The example of FIG. 8B illustrates a plurality of arrays, e.g., bank quadrants 8150-1, 8150-2, sections of arrays, etc., which may have memory cells accessed by digit lines 8168.

In the example of FIG. 8B, the bank quadrants 8150-1 and 8150-2 are shown having a pitch that is approximately sixteen thousand (16K) digit lines 8168 wide according to a given feature dimension (design rule) of a digit line fabrication process. Also shown are a plurality of shared I/O lines 8144-1, 8144-2, . . . , 8144-Z which can have a different pitch that is a function, e.g., multiple, of the given feature dimension (design rule) of the digit line fabrication process. In the example of FIG. 8B, the data path of the plurality of shared I/O lines 8144-1, 8144-Z have a pitch that is approximately sixteen (16) times greater than that of the digit lines 8168. Hence in this example, there are shown approximately one thousand (1K) shared I/O lines 8144-1, . . . , 8144-Z multiplexed to the 16K digit lines 8168 through 16:1 multiplexors, e.g., 8204-1, . . . , 8204-Z and 8206-1, . . . , 8206-Z, respectively. Embodiments, however, are not limited to the numerical example provided here and more or fewer digit lines 8168 may be multiplexed to a plurality of shared I/O lines 8144-1, . . . , 8144-Z. For example, the shared I/O lines 8144-1, . . . , 8144-Z can have a pitch that is a multiple other than 16 times (e.g., 16×) that of the pitch of the digit lines 8168 as set by a given feature dimension (design rule) of the digit line fabrication process.

As shown in the example of FIG. 8B, a compute component, e.g., among a plurality of compute components 8148-1, . . . , 8148-Z and 8149-1, . . . , 8149-Z, may be associated with each shared I/O line 8144-1, . . . , 8144-Z, respectively. The plurality of compute components 8148-1, . . . , 8148-Z and 8149-1, . . . , 8149-Z may be within a plurality of logic stripes, e.g., 8152-1, 8152-2, . . . , 8152-N shown in FIG. 8A, of a compute unit shown as 8198-1 and 8198-2, respectively. As shown in the example of FIG. 8B, a compute component, e.g., among a plurality of compute components 8148-1, . . . , 8148-Z and 8149-1, . . . , 8149-Z associated with each shared I/O line 8144-1, . . . , 8144-Z, may have a pitch that is equal to the data path of the shared I/O lines 8144-1, . . . , 8144-Z and hence sixteen times (e.g., 16×) that of the digit lines 8168 to the arrays, e.g., 8150-1 and 8150-2. According to various embodiments, since the compute components 8148-1, . . . , 8148-Z and 8149-1, . . . , 8149-Z in the data path of the shared I/O lines 8144-1, . . . , 8144-Z are not restricted in a one to one (e.g., 1× multiple) relationship with the pitch of the digit lines 8168, the compute components 8148-1, . . . , 8148-Z and 8149-1, . . . , 8149-Z are not limited to the "vertical" alignment of the arrays 8150-1 and 8150-2 and, in this example, can be sixteen times (16×) larger. As such, the compute components 8148-1, . . . , 8148-Z and 8149-1, . . . , 8149-Z in the data path of the shared I/O lines 8144-1, . . . , 8144-Z can be used to perform more robust set of logical operations on data values stored therein (e.g., by having a larger footprint and space) such as the above mentioned long shift acceleration, while still being proximate to the arrays 8150-1 and 8150-1 and not off in a peripheral area of the array or memory die.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a number of memory arrays;
a controller; and
a number of artificial intelligence (AI) registers, wherein the number of artificial intelligence registers are configured to enable artificial intelligence operations performed by the apparatus and wherein the number of AI registers are configured to enable an input, an output, a first temporary block, a second temporary block, a neural network, a number of activation functions, a number of bias values for the artificial intelligence operations performed by the apparatus.

2. The apparatus of claim 1, wherein the number of artificial intelligence registers include a first number of registers that define a size of the input, a number of the input, and an initial and last address of the input.

3. The apparatus of claim 1, wherein the number of artificial intelligence registers include a second number of registers that define a size of the output, a number of the input, and an initial and last address of the input.

4. The apparatus of claim 1, wherein the number of artificial intelligence registers include a third number of registers that enable banks in the number of memory arrays for use during the artificial intelligence operations.

5. The apparatus of claim 1, wherein the number of artificial intelligence registers include a fourth number of registers that define a size of a matrix in the neural network, an initial and last address of neurons in the neural network, a number of layers in the neural network.

6. The apparatus of claim 1, wherein the number of artificial intelligence registers include a fifth number of registers that define a size of the first temporary block and an initial and last address of the first temporary block.

7. The apparatus of claim 1, wherein the number of artificial intelligence registers include a sixth number of registers that define a size of the second temporary block and an initial and last address of the second temporary block.

8. The apparatus of claim 1, wherein the number of artificial intelligence registers include a seventh number of registers that define a start and end address for activation functions and a resolution of the activation functions.

9. The apparatus of claim 1, wherein the number of artificial intelligence registers include an eighth number of registers that define a size of the number of bias values, a start and end last address of the number of bias values, and the number of bias values.

10. An apparatus, comprising:
a number of memory arrays; and
a controller, coupled to the number of memory arrays, configured to:
enable an artificial intelligence mode for the memory device to perform artificial intelligence operations by writing an indicator in one of a number of registers; and
perform, in response to enabling the artificial intelligence mode, the artificial intelligence operations using data stored in the number of memory arrays.

11. The apparatus of claim 10, wherein the number of registers are programmed to indicate that the artificial intelligence operations are being performed.

12. The apparatus of claim 10, wherein the number of registers are programmed to indicate that the artificial intelligence operations should be performed at full capability.

13. The apparatus of claim 10, wherein the number of registers are programmed to indicate that only matrix calculations of the artificial intelligence operations should be performed.

14. The apparatus of claim 10, wherein the number of registers are programmed to indicate that the artificial intelligence operations is to proceed to a next neuron and/or layer.

15. The apparatus of claim 10, wherein the number of registers include a register that identifies a number of activations functions stored in the number of memory arrays used during the artificial intelligence operations.

16. The apparatus of claim 10, wherein the number of registers include a register that identifies a status of the artificial intelligence operations.

17. A method, comprising:
writing an indicator in one of a number of registers to enable an artificial intelligence mode for a memory device to perform artificial intelligence operations; and performing, in response to enabling the artificial intelligence mode, the artificial intelligence operations using data stored in a number of memory arrays of the memory device.

18. The method of claim 17, further including programming the number of registers to indicate that the artificial intelligence operations are being performed.

19. The method of claim 17, further including programming the number of registers to indicate that the artificial intelligence operations should be performed at full capability.

20. The method of claim 17, further including programming the number of registers to indicate that only matrix calculations of the artificial intelligence operations should be performed.

* * * * *